United States Patent
Mazur et al.

(10) Patent No.: US 11,699,562 B2
(45) Date of Patent: Jul. 11, 2023

(54) MOTOR CONTROL CENTER WITH ENHANCED CIRCUIT DISCONNECT

(71) Applicant: Rockwell Automation Technologies, Inc., Mayfield Heights, OH (US)

(72) Inventors: David C. Mazur, Mequon, WI (US); Corey A. Peterson, Grafton, WI (US); Robert Dilgard, Shorewood, WI (US); Todd R. Sauve, Oak Creek, WI (US); Peter J. Halpin, Mequon, WI (US); Calvin C. Steinweg, Hartford, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 17/507,426

(22) Filed: Oct. 21, 2021

(65) Prior Publication Data

US 2022/0044901 A1    Feb. 10, 2022

Related U.S. Application Data

(63) Continuation of application No. 16/797,817, filed on Feb. 21, 2020, now Pat. No. 11,158,477.

(51) Int. Cl.
*H01H 71/00* (2006.01)
*H01H 71/12* (2006.01)
(Continued)

(52) U.S. Cl.
CPC .......... *H01H 71/123* (2013.01); *H01H 83/10* (2013.01); *H01H 83/20* (2013.01); *H02H 7/0833* (2013.01); *H01H 2071/006* (2013.01)

(58) Field of Classification Search
CPC .......... H01H 71/123; H01H 2071/006; H02H 7/0822; H02H 1/0092
(Continued)

(56) References Cited

U.S. PATENT DOCUMENTS 5,600,575 A * 2/1997 Anticole ............... H03F 3/3081
                                                      702/132
6,005,735 A * 12/1999 Gleim .................. H02H 7/0833
                                                       360/75
(Continued)

FOREIGN PATENT DOCUMENTS

AU    2012216717 A1    5/2013
CN    204407121 U      6/2015

OTHER PUBLICATIONS

Eaton, "Pow-R-Line X General Purpose Distribution Switchboard," https://www.eaton.com/ca/en-gb/catalog/low-voltage-power-distribution-controls-systems/pow-R-line-X-general-purpose-distribution-switchboard.html, accessed Feb. 20, 2020, 22 pages.

(Continued)

*Primary Examiner* — Adolf D Berhane
*Assistant Examiner* — Afework S Demisse
(74) *Attorney, Agent, or Firm* — Fletcher Yoder, P.C.

(57) ABSTRACT

A system may include a power supply that generates a first voltage. The power supply may couple upstream from an electrical load. The electrical load may operate based at least in part on the first voltage. In some cases, a solid-state circuit breaker may be coupled between the power supply and the electrical load. Furthermore, a control system may be communicatively coupled to the power supply, the electrical load, and the solid-state circuit breaker. The control system may receive an operational status from the solid-state circuit breaker and may update a visualization rendered on a graphical user interface based at least in part on the operational status. The operational status may indicate an operation of the solid-state circuit breaker coupling the power supply to the electrical load.

20 Claims, 10 Drawing Sheets

(51) Int. Cl.
*H01H 83/20* (2006.01)
*H02H 7/08* (2006.01)
*H01H 83/10* (2006.01)

(58) Field of Classification Search
USPC .............. 318/461, 400.08, 400.21, 400.22
See application file for complete search history.

(56) References Cited

U.S. PATENT DOCUMENTS

| | | |
|---|---|---|
| 10,276,321 B2 | 4/2019 | Kennedy et al. |
| 10,541,530 B2 | 1/2020 | Kennedy et al. |
| 2003/0205938 A1 | 11/2003 | Andarawis et al. |
| 2009/0140871 A1 | 6/2009 | Titus et al. |
| 2013/0070745 A1 | 3/2013 | Nixon et al. |
| 2017/0075320 A1 | 3/2017 | Day et al. |
| 2017/0256934 A1 | 9/2017 | Kennedy et al. |
| 2018/0152022 A1 | 5/2018 | Manson |
| 2018/0277317 A1 | 9/2018 | Kennedy et al. |
| 2018/0301294 A1 | 10/2018 | Kennedy et al. |
| 2019/0157021 A1 | 5/2019 | Kennedy et al. |
| 2019/0228635 A1 | 7/2019 | Pop |
| 2019/0341213 A1 | 11/2019 | Kouroussis et al. |
| 2020/0212959 A1 | 7/2020 | Eriksen et al. |
| 2020/0365346 A1 | 11/2020 | Telefus et al. |

OTHER PUBLICATIONS

Abb, "SACE Tmax XT New low voltage moulded-case circuit breakers up to 250 A," Oct. 2015, 346 pages.
Partial European Search Report for Application No. 21158152.5 dated Jul. 28, 2021, 15 pages.
National Concord Engineering Ltd. "Siemens 3VL MCCB Operation," https://www.youtube.com/watch?v=f41WoyYzZNg, Jul. 9, 2009.
Extended European Search Report for Application No. 21158152.5 dated Dec. 3, 2021, 27 pages.
Zhou et al., "A Digital-Controlled SiC-Based Solid State Circuit Breaker with Soft-Start Function for DC Microgrids," Jun. 25-28, 2018, 9th IEEE International Symposium on Power Electronics for Distributed Generation Systems, DOI: 10.1109/PEDG.2018.8447563, pp. 1-7.
Notice of Allowance for U.S. Appl. No. 17/886,738 dated Feb. 21, 2023, 9 pages.

* cited by examiner

MOTOR CONTROL CENTER WITH ENHANCED CIRCUIT DISCONNECT

CROSS-REFERENCE TO RELATED APPLICATIONS

This application is a continuation of U.S. patent application Ser. No. 16/797,817, entitled "MOTOR CONTROL CENTER WITH ENHANCED CIRCUIT DISCONNECT," filed Feb. 21, 2020, which is incorporated by reference herein in its entirety for all purposes.

BACKGROUND

This disclosure relates generally to systems and methods for circuit breakers used within industrial automation systems. More specifically, the present disclosure discusses a solid-state circuit breaker, which may be used to protect a portion of an industrial automation system.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

An industrial automation system may include a variety of components associated with different types of motors and motor-drive configurations. For example, different motor-drive configurations may use different types of protection and electrical isolation systems to protect various electrical components connected to a motor-drive system from certain overvoltage and/or overcurrent situations. To effectively protect and operate a variety of types of motors and electrical systems in an industrial automation system, circuit breakers may be included between an electrical load (e.g., a motor) and a power supply.

SUMMARY

A summary of certain embodiments disclosed herein is set forth below. It should be understood that these aspects are presented merely to provide the reader with a brief summary of these certain embodiments and that these aspects are not intended to limit the scope of this present disclosure. Indeed, this present disclosure may encompass a variety of aspects that may not be set forth below.

In one embodiment, a system may include a power supply that generates a first voltage. The power supply may couple upstream from an electrical load. The electrical load may operate based at least in part on the first voltage. In some cases, a solid-state circuit breaker may be coupled between the power supply and the electrical load. Furthermore, a control system may be communicatively coupled to the power supply, the electrical load, and the solid-state circuit breaker. The control system may receive an operational status from the solid-state circuit breaker and may update a visualization rendered on a graphical user interface based at least in part on the operational status. The operational status may indicate an operation of the solid-state circuit breaker coupling the power supply to the electrical load.

In another embodiment, a method may include receiving, by a processor, a request to initiate a soft-start operation for a solid-state circuit breaker according to a start-up profile of an electrical load; sending, by the processor, one or more commands to the solid-state circuit breaker to initiate the soft-start operation; receiving, by the processor, one or more operational statuses from the solid-state circuit breaker during the soft-start operation of the solid-state circuit breaker; and adjusting, by the processor, an operation of the solid-state circuit breaker during the soft-start operation in response to the one or more operational statuses being greater than an expected value. The adjusting of the operation of the solid-state circuit breaker may include changing a value corresponding to one of the plurality of operational statuses to the expected value.

In yet another embodiment, a tangible, non-transitory computer-readable medium may store instructions executable by a processor of control device associated with a sensing device that, when executed by the processor, cause the control device to perform operations including transmitting a first control signal to the sensing device. The operations may include the control device receiving sensing data from the sensing device in response to the first control signal and generating an operational status based at least in part on the sensing data. The operational status may indicate a state of a solid-state circuit breaker during an ongoing soft-start operation. The operations may include the control device transmitting the operational status to a control system and receiving one or more control commands from the control system. In some cases, the control system may determine the one or more control commands based at least in part on the operational status and an expected operational status. The operations may include the control device transmitting a second control signal to a portion of the solid-state circuit breaker to adjust an operation of the solid-state circuit breaker, where adjusting the operation of the solid-state circuit breaker may include changing a value corresponding to one of the operational status to an expected value corresponding to the expected operational status.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
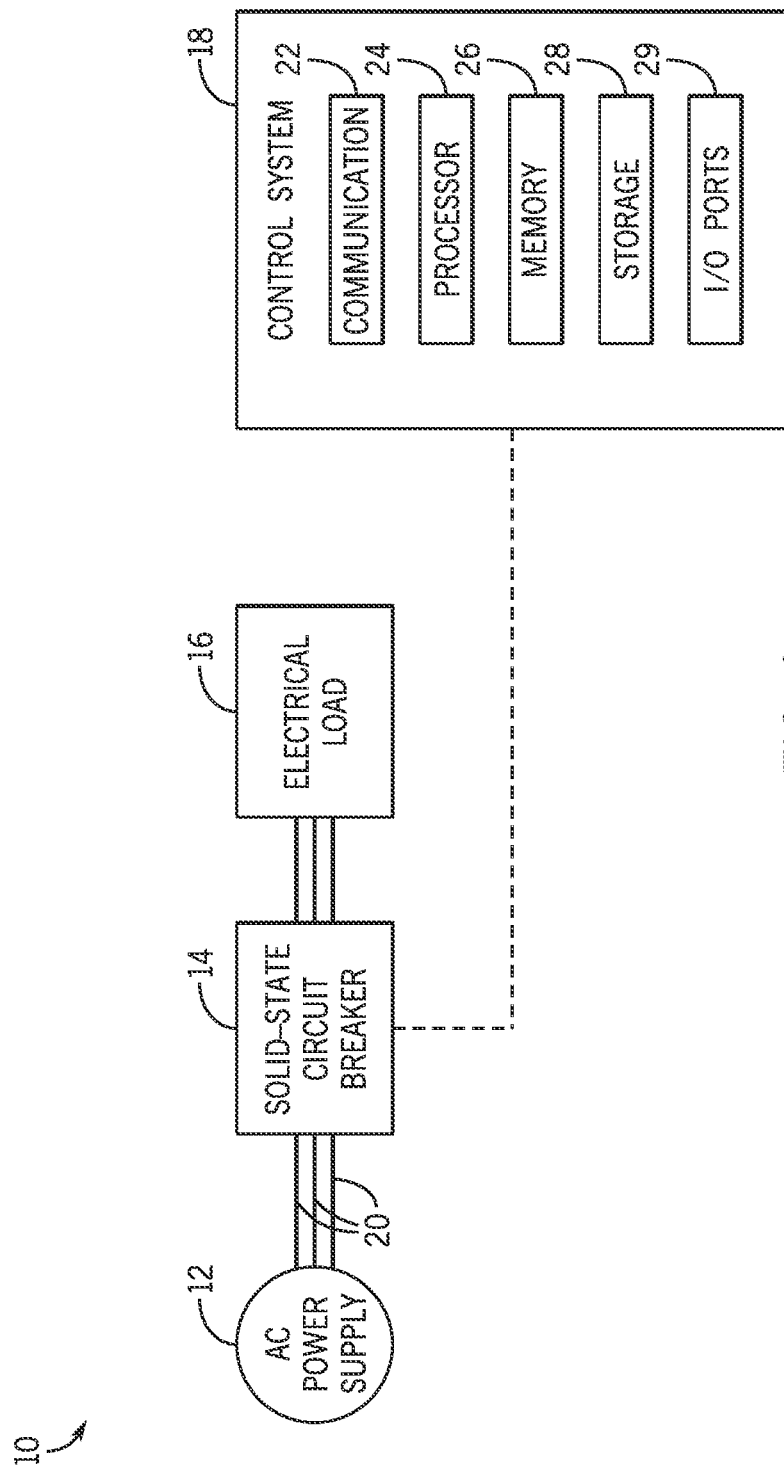
FIG. 1 is a block diagram of a load-feeder system protected by a solid-state circuit breaker, in accordance with an embodiment.

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this present disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements.

The present disclosure is generally directed toward techniques for improving operation of an industrial automation system, and specifically to improving protective circuitry used to protect an electrical load from undesired operating conditions, such as an overvoltage and/or an overcurrent operating condition. Technological advances in integrated circuit technology have enabled solid-state circuitries, such as carbon nanotubes and/or silicon-carbide-based circuitry (SiC-based circuitry), to replace other semiconductor devices within an industrial automation system. Indeed, barriers to using SiC semiconductors have included commercial price and volatility of materials used to form SiC semiconductors, conduction losses associated with driving SiC semiconductors, and heat dissipation challenges associated with driving SiC semiconductors. Furthermore, some SiC semiconductors have conduction losses and heat dissipation challenges that may make devices formed from SiC semiconductors inefficient. Nevertheless, by employing the SiC semiconductors to perform the operations described herein, the benefits achieved in various industrial application may outweigh the drawbacks that are attributed to the barriers discussed above.

In general, protective circuitry built from SiC semiconductor devices may be capable of operating at higher temperatures and/or higher currents relative to traditional systems that do not use SiC semiconductor devices. Semiconductor devices have proved to be challenging to incorporate into circuitries described below due to properties such as, limited thermal conductivity, limited switching frequencies, a relatively low band gap energy, and high-power losses. Thus, protective circuitry, such as circuit breakers, have avoided the use of solid-state circuitry in favor of other protective devices, such as mechanical circuit breakers, fuses, and the like. Devices that use silicon carbide (SiC) semiconductor devices (e.g., SiC insulated-gate bipolar transistors (IGBT), SiC metal-oxide semiconductor field-effect transistor (MOSFET), or other suitable transistor), however, may have relatively improved performance when compared to other types or protective circuitries. For example, protective circuitry that uses a SiC semiconductor device may be capable of withstanding higher voltages (e.g., 10× higher) than other semiconductor devices. This feature may allow the SiC semiconductor to be employed as protection circuitry, as described in more detail below, for industrial applications, which operation in medium to high voltage ranges. Moreover, SiC semiconductor devices may operate under higher ambient temperature conditions, as compared to other semiconductor devices, thereby enabling the SiC semiconductor devices to maintain its reliability while operating in industrial environments.

In addition, as will be detailed below, the protection circuitry used in various industrial applications rely on multiple components to perform distinct functions. Each of these components are incorporated into the design of enclosures used to house the components. As a result, the housing may become larger as more protection circuit components are used to protect various parts of the industrial system. By performing the embodiments described herein, the functionalities of these separate components may be integrated into the SiC semiconductor devices to reduce the form factor or size of the enclosures previously used to house the protection circuit components. The reduced size attributes for the various types of protection circuitries may enable the industrial automation systems to perform in more confined areas. Moreover, although the costs associated with the SiC semiconductor devices may continue to deter use of SiC semiconductor devices in certain industrial applications, by employing the embodiments described herein, the SiC semiconductor devices may be used to efficiently replace a number of components to allow operations to be controlled in a more effective manner in a limited amount of space.

An example protective device that includes SiC semiconductor devices may be a solid-state circuit breaker. Solid-state circuit breakers may provide the particular advantage of not using mechanical switching to open or close a circuit. Reducing or eliminating use of mechanical switching may reduce a likelihood of arc flash and/or reduce a severity of exposed incident energy if an arc flash were to occur. When occurrences of arc flash are reduced, reliability and lifespans of systems using solid-state circuit breakers may improve (e.g., increase). Furthermore, since a likelihood of arc flash may be eliminated and/or reduced when using a solid-state circuit breaker, operators of solid-state circuit breakers may reduce a level of personal protective equipment (PPE) worn while operating the solid-state circuit breakers, such as the level of PPE worn when restarting (e.g., coupling line-side (or supply-side) to load-side, coupling supply-side to load-side) a solid-state circuit breaker after a trip event of the solid-state circuit breaker. This may also apply to levels of PPE worn when working around or nearby to equipment protected by the solid-state circuit breaker (e.g., equipment downstream from the solid-state circuit breaker).

Keeping the foregoing in mind, motor control centers (MCCs) may be designed to use solid-state circuit breakers compatible with three-phase (e.g., multi-phase) electrical distribution systems. The solid-state circuit breakers may be used as an independent electrical feeder (e.g., main line) and/or as a motor starter, in combination with additional solid-state circuit breakers as a motor starter, and/or in similar operation as a non-solid-state circuit breaker. As such, the solid-state circuit breaker may be suitable for protection of electrical couplings between a power source or supply for a motor and the motor (e.g., feeder between a generator and a motor as depicted in FIG. 1), as well as for protection of electrical couplings between an inverter and a motor (e.g., as overload protection circuitry depicted in FIG. 2). When using the solid-state circuit breaker as a motor starter, the solid-state circuit breaker may be operated to perform a reverse starting operation, a non-reverse (e.g., forward) starting operation, a soft-start starting operation (e.g., stepped starting operation), and the like.

By definition, a starter that does not implement SiC semiconductor technologies may include three major components: a galvanic disconnecting device with branch circuit protection (e.g., a circuit breaker, fused disconnect switch), a thermal overload protection device (e.g., electronic overload), and an isolating device in the form of a contactor. These three components work together as a starter assembly for a motor load (e.g., electric motor circuit), such as a full voltage non-reversing starter system. For example, each disconnect switch in a starter may operate at a same time to open or close the electrical circuit to the motor load.

In another embodiment of a starter, such as a full voltage reversing starter, a second contactor may be added to a circuit of the starter in parallel with a first contactor, providing an electrical phase reversal of two phases feeding the starter (e.g., line 1 (L1), line 3 (L3)). By interlocking these contactors and swapping phases, one contactor may be engaged in the "on" position at a given time. As the second contactor has two electrical phases swapped, the electrical phase rotation is 180 degrees different from the first contactor and may drive a motor in the reverse direction.

In the industrial automation system, the starter described above (e.g., full voltage non-reversing starter) may be replaced by a starter that uses SiC semiconductors to improve operation of the starter without SiC semiconductors. For example, the electronic overload device and isolation switch between line-side (e.g., supply-side) and load-side of the above-referenced starter (e.g. contactor functionality) may be embedded within a solid-state circuit breaker as a single component. These components, embedded into a single solid-state circuit breaker, may eliminate the contactor and overload components.

By applying a similar manufacturing principle to the full voltage reversing starter, a new starter may be formed by including SiC semiconductor devices additionally or alternatively to non-SiC devices. For example, the electronic overload device and isolation switches (e.g. contactors) may be embedded within a solid-state circuit breaker, and the solid-state circuit breaker may use firmware to provide similar or equivalent phase reversal capabilities as the electronic overload device and/or isolation switches. These components, as embedded into a single solid-state circuit breaker, eliminate the contactors and overload components.

In these discussed examples of full voltage starters (e.g., reversing, non-reversing), branch circuit protection is provided as a function of the solid-state circuit breaker itself. The solid-state circuit breaker may also operate to interrupt its circuit aligned with (e.g., at a suitable frequency, at a suitable response time) various standards of electrical governing bodies. Similarly, the solid-state circuit breaker may also operate in response to detection of a short circuit with a response time and/or response behavior in accordance with the standards of electrical governing bodies.

Some solid-state circuit breakers may include an integrated air-gap disconnect. The integrated air-gap disconnect may permit galvanic isolation between line-side and load-side within the solid-state circuit breaker as opposed to in line with the solid-state circuit breaker. Control circuitry of the solid-state circuit breaker may utilize the integrated air-gap disconnect to perform lockout/tagout control operations. The galvanic isolation protection provided within the solid-state circuit breaker may be further supplemented by including an additional circuit breaker and/or fused disconnect switch upstream of the solid-state circuit breaker, such as to further decouple the solid-state circuit breaker from a portion of a circuit. In some cases, the solid-state circuit breaker may be associated with a latch mechanism that interlocks the solid-state circuit breaker. Interlocking the solid-state circuit breaker may stop an operator from removing the solid-state circuit breaker while the solid-state circuit breaker is closed.

In some cases, a mechanical device may be included within the solid-state circuit breaker to operate a galvanic disconnecting device within the solid-state circuit breaker additional to or alternative of the latch mechanism and/or the fused disconnect switch. Operating the galvanic disconnecting device into an open position (e.g., such that an air gap is present between metal contacts associated with a line-side and a load-side of the solid-state circuit breaker) may provide mechanical galvanic isolation. It is noted that in some cases the galvanic disconnecting device implements or is the integrated air-gap disconnect. The mechanical device may be installed and attached to a physical disconnect handle that extends to the outside of a motor control center unit or drawer. Operating the physical disconnect handle to cause the mechanical device to operate the galvanic disconnecting device may provide a way to physically decouple a supply-side from a load-side of the solid-state circuit breaker. Physically decoupling the supply-side from the load-side of the solid-state circuit breaker may reduce a likelihood of arcs occurring during the removal of the solid-state circuit breaker and/or may be desired in certain maintenance operations and/or for unit withdrawal, such as to comply with the various electrical governing bodies standards and/or when additional isolation of the solid-state circuit breaker from an electrical supply is desired.

By keeping the foregoing in mind, the solid-state circuit breaker may perform operations of overload protection circuitry, disconnect switching circuitry, and motor controlling circuitry using circuitry within a same physical enclosure, such as when performing starting or steady state operations. This may permit the three devices (e.g., overload protection circuitry, disconnect switching circuitry, and motor controlling circuitry) to be replaced by the solid-state circuit breaker within a starter.

Furthermore, it should be noted that the solid-state circuit breaker may generate relatively large amounts of heat during switching operations since semiconductor materials generally increase in temperature during operation. To combat increases in operating temperatures, a thermal management system may be installed within the motor control center assembly to dissipate and remove heat from the solid-state circuit breaker and/or from air surrounding the solid-state circuit breaker. The thermal management system may create a bonded connection to each solid-state circuit breaker unit or drawer, thereby providing a path from the bonded connection to dissipate thermal energy. For example, the bonded connection and/or path may cause heat to dissipate through a passive heat sink formed from aluminum or other suitable conductive material and/or a heat sink that passively and/or actively involves conduction, such as using ambient air and/or forced air (e.g., cooling air) to keep equipment at a suitable temperature. In some cases, the physical thermal connection between the single component starter and thermal management system may be a heat pipe design that passively and/or actively involves conduction, such as using ambient air and/or forced air (e.g., cooling air) to keep equipment at a suitable temperature.

In some cases, a solid-state breaker may also be operated as part of a selective coordination schemes. For example, a group of solid-state breakers may be logically grouped to protect one or more electrical loads. Two or more protection devices configurable to monitor and protect against overcurrent and/or overvoltage conditions in tandem may be said to be selectively coordinated (e.g., operated in accordance with and/or using selective coordination schemes). As such, two or more selectively coordinated solid-state circuit breakers may work together to protect an electrical load from a fault (or otherwise undesired operation) by opening the downstream solid-state circuit breakers relative to the fault before the upstream solid-state circuit breakers responds to the fault (e.g., by opening).

Furthermore, in some embodiments, a solid-state circuit breaker may include a controller area network (CAN) communicative coupling (e.g., CANBUS®) and/or an internet protocol (IP)-based communicative coupling, such as an Ethernet IP communicative coupling and/or Ethernet internet protocol (IP), to a control system. These communicative couplings may enable the solid-state circuit breaker to directly communicate with the control system (e.g., a microcontroller) without a host computer. The communicative couplings between the solid-state circuit breaker and the control system may be used with a configuration interface. The configuration interface may be a user interface and/or logically-defined data object (e.g., data table) that permits a control system and/or user to provide and/or update a configuration and/or obtain a status of the solid-state circuit breaker. In this way, the configuration interface may be a data boundary used to translate configurations from devices external to the solid-state circuit breaker to a format readable by the solid-state circuit breaker and/or to translate statuses from the solid-state circuit breaker into a format readable by devices external to the solid-state circuit breaker. Indeed, a graphical user interface managed by the control system may enable a user to enter or adjust configurations of the solid-state circuit breaker by changing information stored in the configuration interface.

In some embodiments, the configuration interface may perform a format translation of data associated with it, such as to change a data type or length. The configuration interface may be embedded within computer-readable medium and executed as software to provide a single point of entry to a configuration of the solid-state circuit breaker. It is from the configuration interface that configuration of the solid-state circuit breaker may be dynamically updated in real-time to more suitably operate in a present process and/or present power condition of the industrial automation system.

Node addresses, protection settings (e.g., analog settings, discrete settings), or the like may each be set, reset, and/or defined via data stored in the configuration interface. The configuration interface may also serve as a table of parameters to store configurations in an offline place for download when a replacement of a solid-state circuit breaker were to occur. This may improve start-up or replacement operations of the industrial automation system by reducing downtime associated with a replacement or maintain operation of the solid-state circuit breaker (e.g., since the configuration is relatively easy to download and upload into a device replacement for the solid-state circuit breaker). Additionally or alternatively, the configuration interface may store the requested packet interval from the solid-state circuit breaker to the control system, or vice-versa.

The control system may use the configuration interface to individually monitor and/or control the solid-state circuit breaker even while connected to other circuit breakers and/or devices. The configuration interface may facilitate in the control system providing a dynamic user interface on a graphical user interface that may enable an operator to configure properties of the solid-state circuit breaker. In some cases, different operators may have different levels of authentication that permit the different operators varying control and/or access levels to the operation of the solid-state circuit breaker, where the levels of authentication may be defined by a permission parameter associated with an operator profile for the operator. Indeed, some operator profiles (e.g., user profiles) may have different levels of access to information associated with operation of the solid-state circuit breaker (e.g., information accessible via a configuration interface).

The solid-state circuit breaker may communicate with the control system and/or other industrial automation control devices (e.g., computing devices, solid-state circuit breakers) using any suitable communication or programming technique. For example, additional devices may interface with the solid-state circuit breaker using direct programming techniques and/or supporting programming languages, such as structured text, ladder logic, sequential function chart, functional block programming, or the like. Real-time information may be exchanged between the solid-state circuit breaker and other devices, such as the control system. One of the solid-state circuit breaker and/or the control system may initiate the communication, and at the request for communication instruct the device with a requested packet interval. Communication between the solid-state circuit breaker and the control system may occur at the requested packet interval and cause a populating of a data table of the control system.

The control system may receive information from the solid-state circuit breaker in the form of logical tags. These logical tags may be used in process automation control strategies. The information from the solid-state circuit breaker may be extracted in an operator-defined data type (e.g., P_SolidStateBreaker) that may encapsulate real-time data from the solid-state circuit breaker in an object-oriented model. The solid-state circuit breaker may be represented by one or more visualizations of the object-orientated model, and thus any displayed statuses of the solid-state circuit breaker may change in real-time as data transmits to the control system from the solid-state circuit breaker. A human-machine interface presented on a display of a computing device may present the object-orientated model. Furthermore, the logical tags and information from the solid-state circuit breaker may populate computing applications to create a logical model of an MCC itself. Additional details with regard to the solid-state circuit breaker described above will be discussed below with reference to FIGS. 1-10.

By way of introduction, FIG. 1 is a block diagram of a feeder system 10 (e.g., motor feeder system, motor control center (MCC) feeder system), which may be part of an industrial automation system. The feeder system 10 may include a power supply, such as an alternating current (AC) power supply 12, to supply power to loads coupled downstream. The feeder system 10 may also include a solid-state circuit breaker 14 coupled to the AC power supply 12. The AC power supply 12 may supply current and/or voltage to an electrical load 16 coupled to the solid-state circuit breaker 14.

When abnormal operation occurs, such as when a voltage that is uncharacteristically high or low is delivered to the electrical load 16, the solid-state circuit breaker 14 may electronically disconnect the AC power supply 12 from the electrical load 16. As such, the solid-state circuit breaker 14 may protect the electrical load from supply voltages and/or supply currents that may damage the solid-state circuit breaker 14.

Any suitable number of supply devices may be represented by the AC power supply 12, such as any combination of rectifiers, converters, power banks, generation devices, or the like. It should be understood that the feeder system 10 may include one or more motor-drive systems, motors, MCCs, or the like as the electrical load, or coupled between any of the depicted devices and that the feeder system 10 may include one or more additional components not depicted in FIG. 1.

For example, the feeder system 10 may include any suitable type of rectifier device that includes a number of switches controllable by any suitable power converter. For example, the AC power supply 12 may include an active front end (AFE) converter, a diode converter, a thyristor converter, a diode front end rectifier, or the like. In some embodiments, the switches of the AC power supply 12 may be semiconductor-controlled devices, transistor-based (e.g., insulated-gate bipolar transistor (IGBT), metal-oxide semiconductor field-effect transistor (MOSFET), or other suitable transistor) devices, or other suitable devices in which the opening and/or closing of the switch may be controlled using an external signal (e.g., gate signal), which may be provided by the control system 18. The AC power supply 12 may provide AC supply signals (e.g., AC voltage, AC current, a regulated AC output) on a bus 20, which may be provided to the solid-state circuit breaker 14.

It is noted that the feeder system 10 may be used in a variety of industrial automation systems, such as food manufacturing, industrial operations systems, refineries, or the like. In this way, implementation and use of the solid-state circuit breaker 14 to protect various electrical loads may improve operations of industrial automation systems. For example, using a solid-state circuit breaker 14 may reduce or eliminate usage of electrical protection devices that rely at least partially on mechanical switching. Reducing or eliminating use of mechanical switching may reduce a likelihood of arc flash and/or reduce a severity of exposed incident energy if an arc flash were to occur. When occurrences of arc flash are reduced, reliability and lifespans of systems using solid-state circuit breakers 14 may improve (e.g., increase) and operators may reduce a level of personal protective equipment (PPE) worn while operating nearby to the solid-state circuit breaker 14.

Industrial automation systems may operate in response to signals generated by the control system 18. The control system 18 may include any suitable number of electronic devices and/or components to generate and/or manage generation of the control signals. For example, the control system 18 may include a communication component 22, a processor 24, a memory 26, storage 28, and input/output (I/O) ports 29, or the like, for generating and managing generation of control signals.

The communication component 22 may be a wireless or wired communication component that facilitates communication between the control system 18, the solid-state circuit breaker 14, or other suitable electronic devices. The processor 24 may be any type of computer processor or microprocessor capable of executing computer-executable code. The memory 26 and the storage 28 may be any suitable articles of manufacture that may serve as media to store processor-executable code, data, or the like. These articles of manufacture may represent computer-readable media (i.e., any suitable form of memory or storage) that may store the processor-executable code used by the processor 24 to perform the presently disclosed techniques, such as to predictively response to operational changes, or the like.

The I/O ports 29 may couple to one or more sensors, one or more input devices, one or more displays, or the like, to facilitate human or machine interaction with the control system 18, the solid-state circuit breaker 14, or other suitable electronic devices. For example, based on a notification provided to the operator via a display, the operator may use an input device to instruct the adjustment of a parameter associated with the solid-state circuit breaker 14.

Keeping the foregoing in mind, sometimes the control system 18 may communicate with the solid-state circuit breaker 14 using one or more communication techniques. For example, the solid-state circuit breaker 14 may include a controller area network (CAN) communicative coupling and/or an internet protocol (IP)-based communicative coupling, such as an Ethernet IP communicative coupling, to the control system 18. These communicative couplings may enable the solid-state circuit breaker 14 to communicate with the control system 18 without intervention from a host computer. Thus, the solid-state circuit breaker 14 may communicate directly with the control system 18 without using an intervening computing device.

In some cases, the control system 18 may use one or more configuration interfaces to communicate with the solid-state circuit breaker 14. The configuration interface may be a graphical user interface and/or logically-defined data object (e.g., data table) that permits the control system 18 and/or user to provide and/or update a configuration and/or to obtain a status of the solid-state circuit breaker. In this way, the configuration interface may be a data boundary used to translate configurations from devices external to the solid-state circuit breaker 14 to a format readable by the solid-state circuit breaker 14 and/or to translate statuses from the solid-state circuit breaker 14 into a format readable by devices external to the solid-state circuit breaker 14.

In some embodiments, the configuration interface may perform a format translation of data associated with it, such as to change a data type or length. For example, the configuration interface may facilitate changing an analog-defined parameter (e.g., data value, status) into a digitally-defined parameter, a Boolean-defined parameter into a Floating-point-defined parameter, from a character-defined parameter into a string-defined parameter, from an integer-defined parameter into a Boolean-defined parameter, or any combination thereof. The configuration interface may be embedded within computer-readable medium and executed as software to provide a single point of entry to a configuration of the solid-state circuit breaker. It is from the configuration interface that configuration of the solid-state circuit breaker may be dynamically updated in real-time to more suitably operate in a present process and/or present power condition of the industrial automation system.

A configuration interface may be associated with a table, or other type of data storage and/or data object, used to store parameters, information, identifiers, set-points, or the like. To communicate with the solid-state circuit breaker 14, the control system 18 may reference an identifier stored in a table associated with the communication interface and use the identifier to prefix a message and/or data packet to the solid-state circuit breaker 14 (e.g., a control system of the solid-state circuit breaker 14). The control system 18 may store information received from the solid-state circuit breaker 14 into the table (e.g., a current indication of data from a sensing operation), or the like, to associate the information with the configuration of the solid-state circuit breaker 14. The control system 18 may also use the configuration interface for a variety of suitable operations related to control and/or communication with the solid-state circuit breaker 14. For example, the control system 18 may determine, from the configuration interface, a first expected value range (e.g., a first data value and a second data value) associated with a first operation of the solid-state circuit breaker 14. In this way, the control system 18 may identify an undesired operation if a received sensed value was determined to not be between the first data value and the second data value (e.g., greater than or less than the expected value range).

Usage of the configuration interface may permit the control system 18 to individually monitor and/or control the solid-state circuit breaker 14 even while connected to other circuit breakers and/or devices. For example, the configuration interface may provide a direct communicative coupling from the control system 18 to the solid-state circuit breaker 14, even when a communicative coupling is shared between multiple solid-state circuit breakers 14, such as by routing communications and/or commands directly between the control system 18 and the solid-state circuit breaker 14. The configuration interface may permit configuration of properties of the solid-state circuit breaker 14 while the solid-state circuit breaker 14 is online. These properties may include an IP Address assigned to the solid-state circuit breaker 14 to permit communication between the control system 18 and the solid-state circuit breaker 14 and/or a node address (e.g., CAN node address) to permit the control system 18 to address the solid-state circuit breaker 14 as one of many nodes. Additionally or alternatively, the configuration interface may store the requested packet interval from the solid-state circuit breaker 14 to the control system 18, or vice-versa, where the requested packet interval may be a data transfer rate and/or data transmission frequency rate specified by a first device for a second to comply with when sending information or data to the first device.

In this way, the control system 18 may use configuration interface-based communication techniques to identify an IP address and/or the node address of the solid-state circuit breaker 14 to communicate with the solid-state circuit breaker 14 according to the requested packet interval. Knowing the IP address and/or node address of the solid-state circuit breaker 14 may permit a direct routing of information and/or commands to the solid-state circuit breaker 14.

The configuration interface may also serve as a table of parameters to store configurations in an offline place for download when a replacement of a solid-state circuit breaker 14 were to occur. This may improve start-up or replacement operations of the industrial automation system by reducing downtime associated with a replacement or maintain operation of the solid-state circuit breaker 14 (e.g., since the configuration is relatively easy to download and upload into a device replacement for the solid-state circuit breaker 14).

In some cases, the control system 18 may use the configuration interface-based communication techniques to instruct the solid-state circuit breaker 14 into a particular mode of operation. The mode of operation may define how signals are transmitted through or from the solid-state circuit breaker 14. For example, the solid-state circuit breaker 14 may be instructed into a soft-start operational mode, a forward operational mode, and/or a reverse operational mode, and thus may behave like a motor starter. In some cases, the solid-state circuit breaker 14 may be operated in combination with one or more additional solid-state circuit breakers 14 also operated into the same operational mode. The soft-start operational mode may cause the solid-state circuit breaker 14 to provide incrementally-generated supply power or supply signals to the electrical load 16, such as to provide a start-up level of supply signals at a relatively gradual pacing or timing. The forward operational mode may cause the solid-state circuit breaker 14 to provide supply power in a way to cause the electrical load to operate in a forward direction relative to a reference direction, while the reverse operational mode may cause the solid-state circuit breaker 14 to provide supply power in a way as to cause the electrical load to operate in a reverse direction relative to the reference direction.

The control system 18 may also permit configuration of properties of the solid-state circuit breaker 14 based at least in part on thermal measurements and/or metering information, such as phase-phase voltages, phase-to-ground voltages, input current, output current, frequency, power, status of the solid-state circuit breaker 14 (e.g., Open Close, Blocked, Failure), or the like. In this way, the control system 18 may determine a current operation of the solid-state circuit breaker 14 and use the information of the current operation to determine how to adjust an operation of the solid-state circuit breaker 14. For example, the control system 18 may determine that the solid-state circuit breaker 14 is blocked and has a thermal measurement higher than a historical average for the solid-state circuit breaker 14. Using this information, the control system 18 may determine that an undesired operation is occurring, and thus may determine to open the solid-state circuit breaker 14. Furthermore, the control system 18 may use this information to operation other devices upstream and/or downstream of the solid-state circuit breaker 14, such as controlling additional protection circuitry to further isolate the solid-state circuit breaker 14 from the industrial automation system.

The properties, in some embodiments, may also be used to define operation limits corresponding to determined settings to be used to protect the load. The operation limits may correspond to operating ranges set by governing agencies or standard committees, such as American National Standards Institute (ANSI®), Underwriters Laboratories (UL®), International Electrotechnical Commission (IEC®) or the like, and may be used to protect the solid-state circuit breaker 14, the electrical load 16, or the like from undesired operating conditions. Furthermore, the properties may also define protection groups or classes associated with the solid-state circuit breaker 14. Protection groups or classes may correspond to groups of electrical loads 16 that may have a same protection scheme. These protection groups or classes may be classifications of types of protection for different devices set by governing agencies or standard committees. When the electrical load 16 is classified as part of a protection group with another electrical load 16, it may be desired to protect both electrical loads 16 with a solid-state circuit breaker 14 set to the same settings. In this way, when a different electrical load 16 is installed to the solid-state circuit breaker 14, the protection groups or classes may be updated to indicate the new group or class of the new electrical load 16. This may cause the solid-state circuit breaker 14 to automatically update its operational settings to accommodate the new electrical load 16. Use of properties may thus improve deployment of setting changes to solid-state circuit breakers 14 by making an overall installation process of a new electrical load 16 relatively faster since less time is spent updating operational settings of the solid-state circuit breaker 14. In some embodiments, the solid-state circuit breaker 14 may detect a protection group or class of its electrical load 16 automatically and/or without receiving the property from the control system 18. In these cases, the solid-state circuit breaker 14 may sense metering information (e.g., operational properties) of the electrical load 16 to determine what protection group or class applies to the electrical load 16. For example, the solid-state circuit breaker 14 may determine that it outputs three-phase power and that its load is operating at a relatively high voltage that corresponds to an operating voltage of a large motor load, thus the solid-state circuit breaker 14 may automatically classify its electrical load 16 as a large motor based on this analysis.

In some cases, the control system 18 may use configuration interface techniques to receive thermal measurements and/or metering information directly from the solid-state circuit breaker 14. For example, the solid-state circuit breaker 14 may directly report values sensed by one or more measurement circuitries coupled to one or more portions of the solid-state circuit breaker 14 via updating of data stored in a table, data object, or the like, associated with the configuration interface between the solid-state circuit breaker 14 and the control system 18. As such, the solid-state circuit breaker 14 may report its sensed values including, but not limited to, ambient temperature, internal temperature, phase-to-phase voltage, internal voltage, phase-to-line voltage, current, frequency, power input, power output, or the like. Furthermore, in some cases, the solid-state circuit breaker 14 may report its status, such as whether it is operated in an open state (e.g., Open status), a closed state (e.g., Closed status), whether its closing/opening function is blocked and/or functionally prevented (e.g., Blocked status), and/or whether the solid-state circuit breaker 14 is non-operational and/or uncommunicative (e.g., offline) in the same data object associated with the configuration interface.

These various statuses, control operations, and other datasets may be communicated between the control system 18 and the solid-state circuit breaker 14 using any suitable communication or programming technique. For example, additional devices, such as the control system 18, may interface in real-time with the solid-state circuit breaker 14 using direct IEC® 61131 programming techniques and/or supporting programming languages, such as structured text, ladder logic, sequential function chart, functional block programming, or the like. It is noted that in some cases, the solid-state circuit breaker 14 may retain and/or generate an information log (e.g., such as within the storage 28) that may be reported to at a later time to the control system 18. The information log may store and/or track various alarm states, alerts, operations, sensed values, statuses, or the like generated by the solid-state circuit breaker 14.

One of the solid-state circuit breakers and/or the control system may initiate the communication. When communication is requested, the requesting device may self-report a desired communication frequency, such as a requested packet interval to use with the communication. As such, communication between the solid-state circuit breaker 14 and the control system 18 may be configurable at request to any real-time communication system needs, such as to dynamically adjust communications to a current bandwidth to be used to communicate with the control system 18. The requested packet interval may define a time period to use when transmitting information packets between the solid-state circuit breaker 14 and the control system 18.

The solid-state circuit breaker 14 and the control system 18 may communicate at the requested packet interval, and thus a data table of the control system 18 may populate at a rate proportional and/or based on the requested packet interval. When using the configuration interface-based communication techniques, the control system 18 may receive information from the solid-state circuit breaker 14 that includes logical tags (e.g., a logical tag corresponding to an identifier for the solid-state circuit breaker 14 and/or particular information regarding operation of the solid-state circuit breaker 14). Information reported to the control system 18 may be linked to the logical tags. The logical tags may be used in process or automation control strategies since the logical tag is static relative to the information reported as being associated with the logical tag (e.g., the logical tag may identify a reported value as a "circuit breaker X temperature," such that each time information is reported with the logical tag, the information is stored at the control system 18 is a suitable location of the memory 26 and/or the storage 28).

Information from the solid-state circuit breaker 14 may be extracted in an operator-defined data type corresponding to the logical tag (e.g., P_SolidStateBreaker) that may encapsulate real-time data from the solid-state circuit breaker in an object-oriented model. The solid-state circuit breaker may be represented by one or more visualizations of the object-orientated model, and thus any displayed statuses of the solid-state circuit breaker may change in real-time as data transmits to the control system from the solid-state circuit breaker. For example, the solid-state circuit breaker 14 may be represented by one or more visualizations of the object-orientated model, and thus any displayed statuses of the solid-state circuit breaker 14 may change in real-time as data is transmitted to the control system 18 from the solid-state circuit breaker 14. A human-machine interface presented on a display of a computing device may present the object-orientated model. Furthermore, the logical tags and information from the solid-state circuit breaker 14 may feed computing applications to create a logical model of an MCC and/or electrical system that include the solid-state circuit breaker 14.

Figure 2:
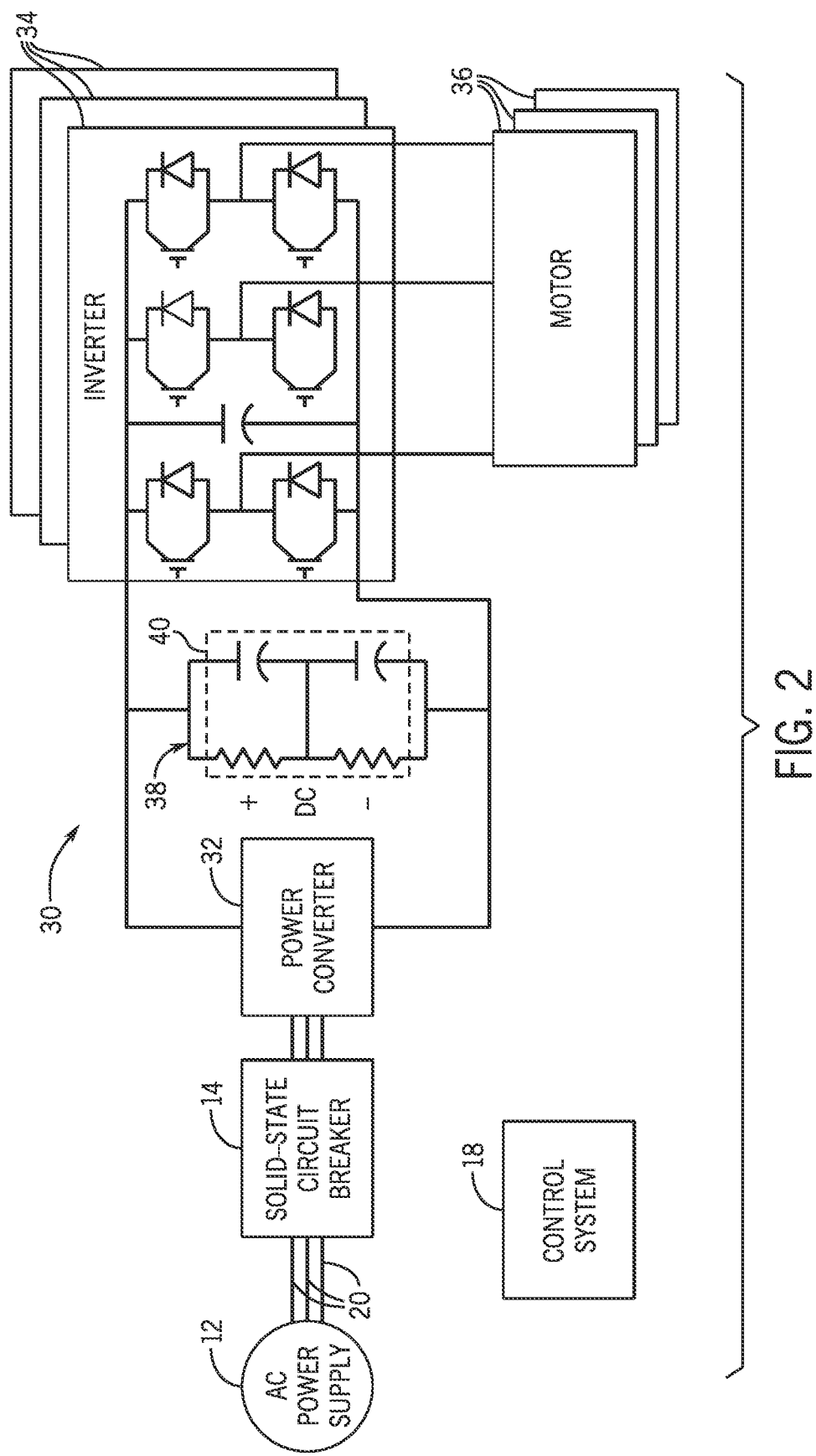
FIG. 2 is a block diagram of a motor-feeder system protected by the solid-state circuit breaker of FIG. 1, in accordance with an embodiment.

Keeping the forgoing in mind, FIG. 2 is a block diagram of a motor-feeder system 30, an example of the feeder system 10. FIG. 2 illustrates how the electrical load 16 may include a power converter 32, an inverter 34, a motor 36, and a direct current (DC) bus 38. The motor-feeder system 30 may be part of an industrial automation system. The motor-feeder system 30 may include the power converter 32 and the control system 18 that may control the operation of the power converter 32. The motor-feeder system 30 may also include one or more inverters 34. The inverters 34 may convert the DC voltage output by the power converter 32 into a controllable AC voltage used to power the motor 36.

In general, the power converter 32 may receive three-phase alternating current (AC) voltage from the AC power supply 12 and convert the AC voltage into a direct current (DC) voltage (e.g., voltage on DC voltage bus 38) suitable for powering a load (e.g., rectify a DC voltage based on the voltage from the AC power supply 12). It is noted that in some examples, the AC power supply 12 is replaced by a DC power supply, and the power converter 32 may operate to filter and/or improve a signal quality of the DC power supply. As such, the power converter 32 supplies a load, such as the one or more inverters 34, a DC voltage on the DC voltage bus 38. In certain embodiments, the one or more inverters 34 then convert the DC voltage to an AC voltage to be supplied to one or more devices connected to the inverters 34, such as motors 36. The one or more inverters 34 may then, in turn, control the speed, torque, or other suitable operation of the one or more devices (e.g., one or more motors 36) by controlling the AC voltage provided to the one or more devices. It should be understood that the industrial automation system may include one or more motor-feeder systems 30, and each of the motor-feeder systems 30 may include one or more additional components not depicted in FIG. 1.

The power converter 32 may include any suitable power converter device that includes a number of switches that may be controlled. For example, the power converter 32 may be an active front end (AFE) converter, a diode converter, a thyristor converter, a diode front end rectifier, or the like. In some embodiments, the switches of the power converter 32 may be semiconductor-controlled devices, transistor-based (e.g., IGBT, MOSFET, or other suitable transistor) devices, or other suitable devices in which the opening and/or closing of the switch may be controlled using an external signal (e.g., gate signal), which may be provided by the control system 18. The power converter 32 may provide the DC voltage (e.g., a regulated DC output voltage) on a direct current (DC) bus 38, which may be provided to the inverters 34 and may regenerate extra or additional power back to the AC power supply 12 (or DC power supply). The power converter 32 may also operate to maintain a unity power factor, generate a stable DC voltage from the AC power supply 12 (or DC power supply), control a power factor transmitted to the one or more inverters 34, and the like to generally control power supplied to the one or more inverters 34.

As discussed above, the power converter 32 may use the switching frequencies of the switches (e.g., power conversion devices) to convert the voltage from the AC power supply 12 into the DC voltage. The DC voltage may be generated across a resistor-capacitor (RC) circuit 40 including one or more resistors and one or more capacitors. In addition, the control system 18 may control the operation of the power converter 32 to compensate for resonance, unknown line impedances, and the like.

The motor-feeder system 30 may be at least partially protected by use of the solid-state circuit breaker 14. When the solid-state circuit breaker 14 detects or receives a notification of an upstream fault and/or a downstream fault event, control circuitry of the solid-state circuit breaker 14 may cause the solid-state circuit breaker 14 to automatically open. In particular, the solid-state circuit breaker 14 may protect the motors 36 by opening in response to sensing one or more sensed parameters and determining that the one or more sensed parameters are greater than one or more threshold values corresponding to a desired operation of the motor-feeder system 30.

Figure 3:
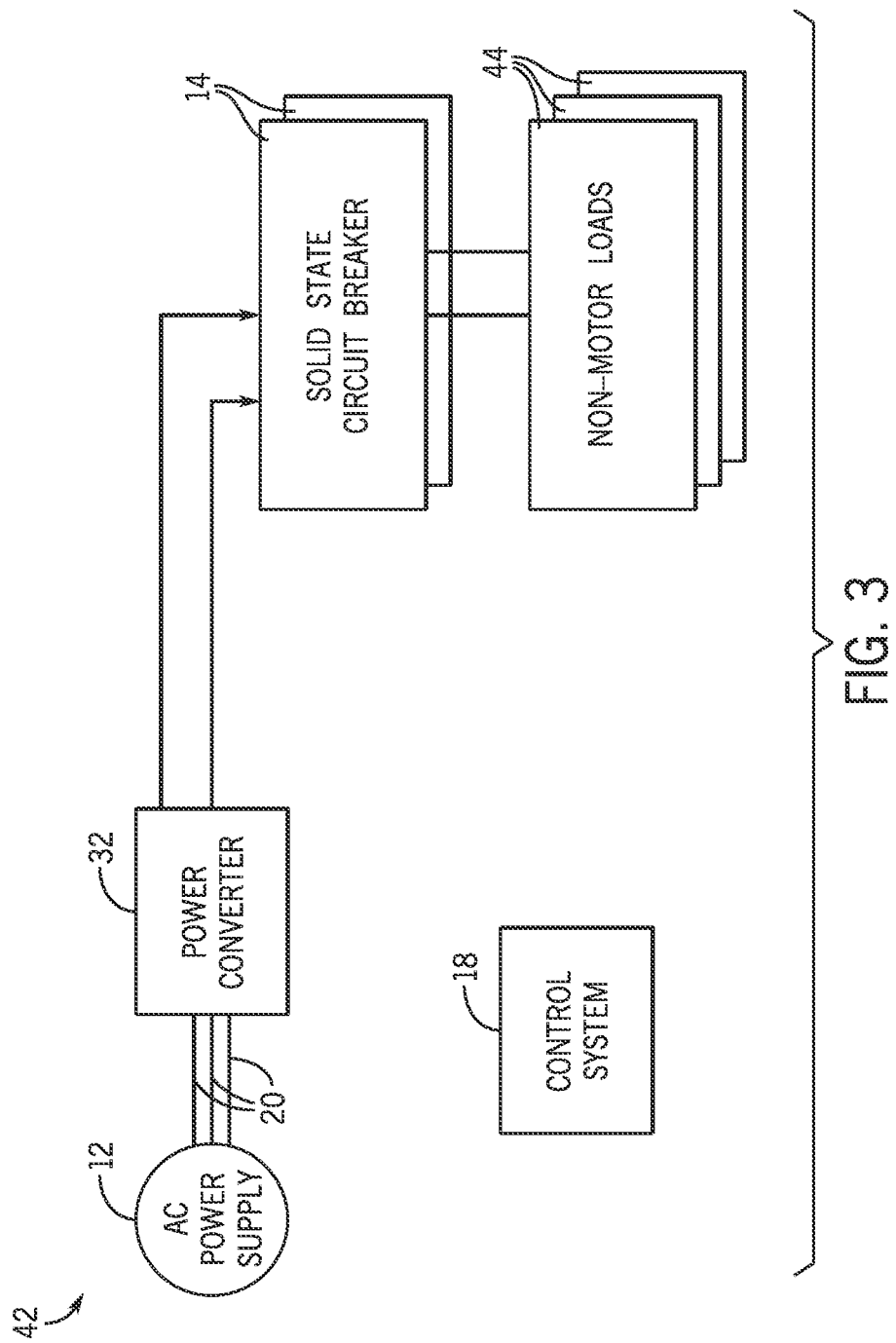
FIG. 3 is a block diagram of non-motor-feeder system protected by direct current (DC) solid-state circuit breaker, in accordance with an embodiment.

The figures described above have illustrated the solid-state circuit breaker 14 placed between the AC power supply 12 (or DC power supply) and the electrical load 16. However, in some cases, the solid-state circuit breaker 14 may be disposed after the power converter 32, as illustrated in FIG. 3. In this case, the solid-state circuit breaker 14 may receive a DC voltage at its line-side and output a DC voltage at its load-side.

FIG. 3 is a block diagram of a non-motor-feeder system 42 protected by the solid-state circuit breaker 14. The solid-state circuit breaker 14 of FIG. 3 may be compatible with direct current (DC) supply voltages and/or DC supply currents (e.g., a generation system that generates DC supply voltages and/or DC supply currents). In the example non-motor-feeder system 42, one or more solid-state circuit breakers 14 may be coupled between a power converter 32 and one or more non-motor loads 44. FIG. 3 depicts one of many suitable uses of the solid-state circuit breaker 14.

Keeping the foregoing in mind, the solid-state circuit breaker 14 may be suitably used to protect a motor 36, a non-motor load 44, or both. Generally, the solid-state circuit breaker 14 may be coupled in line with a feeder bus for the electrical load 16. For example, the solid-state circuit breaker 14 may be coupled between an AC power supply 12 (e.g., a generator) and an electrical load 16 (e.g., motor 36, non-motor load 44).

A control system 18 may receive information from a solid-state circuit breaker 14 in the form of logical tags. These logical tags may be used in process or automation control strategies and may help to organize and/or identify incoming data to the control system 18. The information from the solid-state circuit breaker 14 may be extracted in an operator-defined data type (e.g., P_SolidStateBreaker) that may encapsulate real-time data from the solid-state circuit breaker 14 in an object-oriented model. In this way, the solid-state circuit breaker 14 may be represented by one or more visualizations of the object-orientated model, such as in a visualization rendered on a human-machine interface (HMI) (e.g., a visualized model of the industrial automation system associated with the solid-state circuit breaker 14). The object-oriented model may include displayed statuses of the solid-state circuit breaker 14 and/or data sensed by the solid-state circuit breaker 14. In some cases, the object-oriented model and/or a visualization of the object-oriented model may change in real-time as data is transmitted to the control system 18 from the solid-state circuit breaker 14. A human-machine interface presented on a display of a computing device may present the object-oriented model through one or more visualizations rendered on the display. Furthermore, logical tags and/or information from the solid-state circuit breaker 14 may feed computing applications to facilitate creating a logical model of an MCC itself. The control system 18 may use the computing applications to make control decisions, such as to decide when to electrically open or electrically close the solid-state circuit breaker 14. In some cases, the solid-state circuit breaker 14 may be coupled to the electrical load 16 to replace a motor starter as well as to protect the electrical load 16 from undesired power supply signals.

When using the solid-state circuit breaker 14 as a motor starter, the solid-state circuit breaker 14 may be operated to perform a reverse starting operation, a non-reverse (e.g., forward) starting operation, and a soft-start starting operation (e.g., stepped starting operation) to guide the power-on (e.g., starting) of a motor load. While performing starting or steady state operations, the solid-state circuit breaker 14, as a single device, may perform similar operations of multiple devices (e.g., galvanic disconnecting devices, contactors, thermal overload protection devices) while using circuitry within a same physical enclosure. This may permit the three devices (e.g., galvanic disconnecting devices, contactors, thermal overload protection devices) to be replaced by the solid-state circuit breaker 14 in a starter. To operate the solid-state circuit breaker 14 in the reverse starting operation or the non-reverse starting operation, one or more solid-state circuit breakers 14 may be closed in a particular order to cause the electrical load (e.g., motor 36) to rotate either in a reference direction (e.g., non-reverse) or against the reference direction (e.g., reverse). With a soft-start starting operation, the control system 18 may operate one or more solid-state circuit breakers 14 according to device profiles that define operational ranges for respective devices while powering on the electrical load 16.

Figure 4:
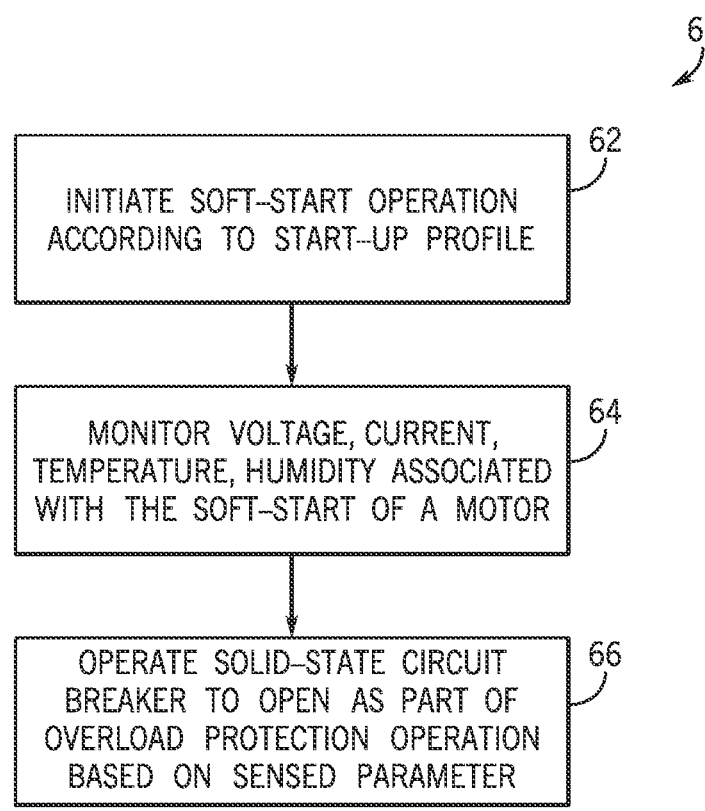
FIG. 4 is a method for operating the solid-state circuit breaker of FIG. 1 as part of a soft-start operation, in accordance with an embodiment.

FIG. 4 is a flowchart of a method 60 performed by the control system 18 to control a soft-start operation of the electrical load 16 (e.g., motor 36, non-motor load 44). Although the method 60 is described below as performed by the control system 18, it should be noted that the method 60 may be performed by any suitable processor that controls operation of the solid-state circuit breaker 14 and/or of the motor 36. Moreover, although the following description of the method 60 is described in a particular order, it should be noted that the method 60 may be performed in any suitable order.

At block 62, the control system 18 may initiate a soft-start operation according to a start-up profile of the solid-state circuit breaker 14 and/or the electrical load 16. Each solid-state circuit breaker 14 and/or electrical load 16 may correspond to a start-up profile. A start-up profile for the electrical load 16 may define a duration of time to use to ramp up average supply voltages and/or supply currents to the electrical load 16, a direction of signals to use to start the load (e.g., forward direction signals or reverse direction signals relative to the reference direction), a frequency of electrical switching (e.g., solid-state switching) to use when starting the electrical load 16, or the like. Each solid-state circuit breaker 14 and/or electrical load 16 may correspond to a unique and/or individually defined start-up profile. Start-up profiles may be stored in memory 26 and/or storage 28 of the control system 18, or in any suitable storage device accessible by the control system 18, such as in a cloud-based and/or Internet-based storage system.

After the start-up profile is loaded and/or accessed by the control system 18, the control system 18 may generate control signals in accordance with the start-up profile, thereby operating the solid-state circuit breaker 14 in accordance with its corresponding start-up profile. Start-up profiles may be associated with configuration interface-based communication techniques and/or may permit individualized operation of each solid-state circuit breaker 14 coupled to the control system 18. For example, the solid-state circuit breaker 14 may receive configurations and/or transmit statuses to the control system 18 using specific references to portions of a data table or data object. In this way, the control system 18 may reference the data table or data object to determine how to start-up the electrical load 16 coupled to the solid-state circuit breaker 14 (e.g., by referencing the start-up profile). While the control system 18 operates the solid-state circuit breaker 14 according to the start-up profile, the control system 18 may receive and monitor various operational statuses of the electrical load 16 and/or of the solid-state circuit breaker 14 during the start-up process. In some cases, operational statuses may be summary reports (e.g., "on," "closed," "off," "open") and/or may be numbers or values indicative of sensed data received from sensing devices. For example, the solid-state circuit breaker 14, such as using a processor associated with the solid-state circuit breaker 14, may generate an operational status in response to operating to open (e.g., decouple its line-side from its load-side).

Thus, at block 64, the control system 18 may monitor data (e.g., operational statuses) regarding operational parameters including voltage, current, temperature, humidity, and the like, of the solid-state circuit breaker 14 and/or the electrical load 16 during start-up of the electrical load 16. For example, soft-starting the motor 36 may involve operating the motor 36 within defined operational parameter ranges (e.g., expected value ranges). Thus, the control system 18 may monitor data from the solid-state circuit breaker 14 and/or the motor 36 to determine how to operate one or more solid-state circuit breakers 14 to soft-start the motor 36, such that the operating parameters remain at values within respective operational parameter ranges. Thus, the respective operational parameter ranges may correspond to desired parameter ranges during start of the motor 36. When the control system 18 determines one or more of the operational parameters is greater than or less than an expected value, the control system 18 may adjust an operation of the electrical load 16 and/or the solid-state circuit breaker 14 to compensate for the deviation.

At block 66, the control system 18 may operate the solid-state circuit breaker 14 to open as part of overload protection operations based at least in part on the data representative of the operational parameters. The opening of the solid-state circuit breaker 14 may be triggered in response to detecting a fault associated with a supply line or a load line of the solid-state circuit breaker 14. Opening the solid-state circuit breaker 14 may prevent a fault from damaging the electrical load 16. In some cases, the control system may detect a deviation from a start-up profile corresponding to the motor 36 and may cause the solid-state circuit breaker 14 to open in response to detecting the deviation. It is noted that in some cases, the control system 18 may cause the solid-state circuit breaker 14 to close after opening. For example, when soft-starting the motor 36, the solid-state circuit breaker 14 may open and closed at different times to simulate contactor driving schemes, where different portions (e.g., poles) of the solid-state circuit breaker 14 may drive different lines between the solid-state circuit breaker 14 and the motor 36.

Keeping the forgoing in mind, the solid-state circuit breaker 14 may be characterized by various physical characterizations. For example, the solid-state circuit breaker 14 may perform electrical isolation operations without employing devices that switch using a mechanical apparatus (e.g., electromagnetic and/or coil-based switching devices). Furthermore, the solid-state circuit breaker 14 may perform operations of galvanic disconnecting devices, contactors, and thermal overload protection devices using solid-state semiconductor circuitry disposed within a same physical enclosure within a housing unit. This may permit the three devices (e.g., overload protection circuitry, disconnect switching circuitry, and motor controlling circuitry) to be replaced by one or more solid-state circuit breakers 14.

Figure 5:
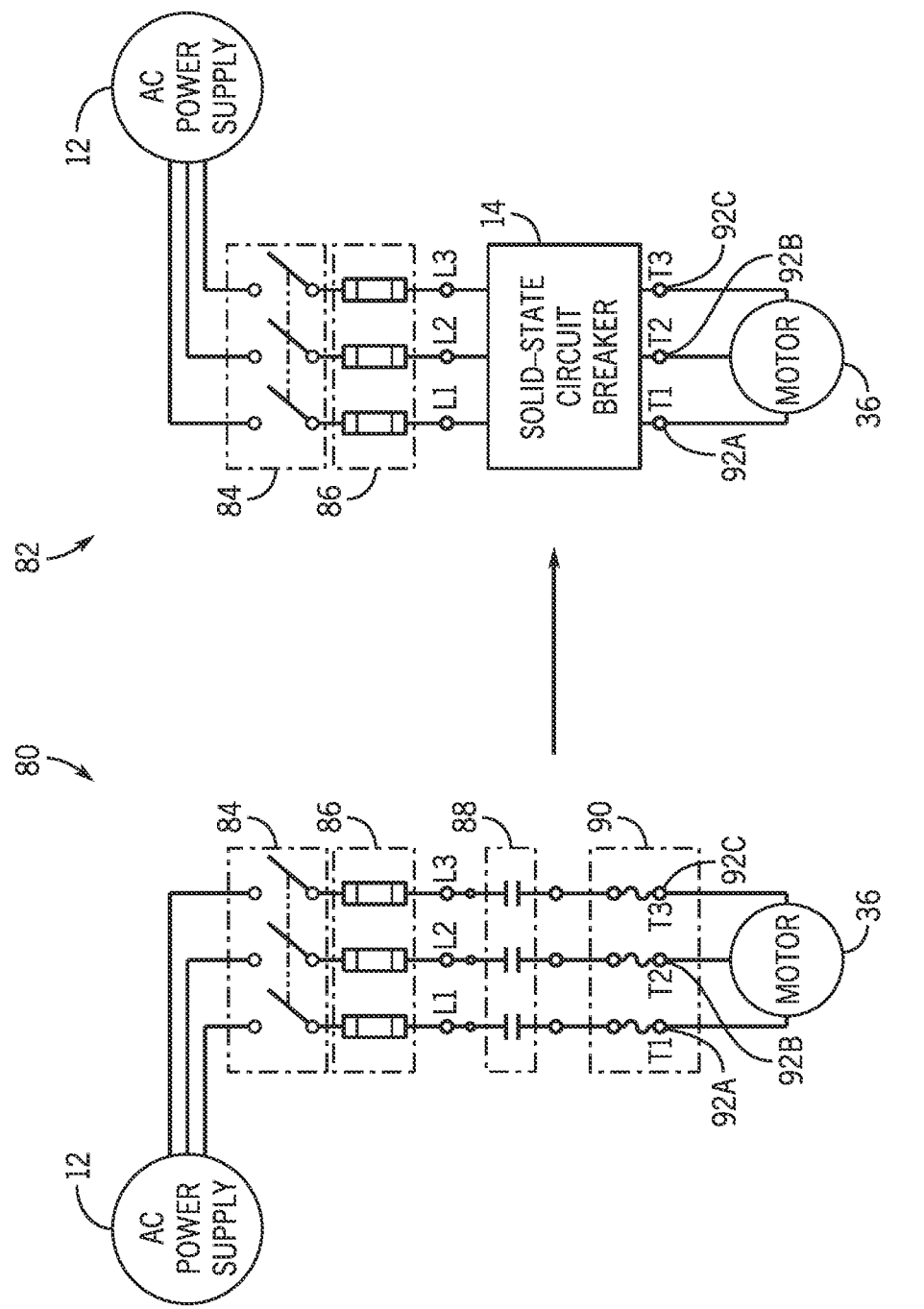
FIG. 5 is a block diagram of a first starter system and a second starter system that uses the solid-state circuit breaker of FIG. 1 to control a motor, in accordance with an embodiment.

To elaborate, FIG. 5 is a block diagram of a starter system 80 and a starter system 82 that uses the solid-state circuit breaker 14. As shown, the starter system 80 includes three distinct physical components: one or more galvanic disconnecting devices 84 with one or more branch circuit protection devices 86 (e.g., circuit breaker, fused disconnect switch), one or more contactors 88 (e.g., isolating devices), and one or more thermal overload protection devices 90 (e.g., electronic overload). These three components work together as an assembly to provide a full voltage non-reversing starter system control operation of the motor 36. For example, the galvanic disconnecting devices 84 may open to provide an air gap between a line-side feeding the solid-state circuit breaker 14 and the solid-state circuit breaker 14. When the galvanic disconnecting devices 84 are closed, contactors 88 may be opened and/or closed in accordance with various starting and/or powering-on patterns, such as to soft-start the motor 36. While each of the contactors 88 are closed, the thermal overload protection devices 90 may respectively monitor each line to the motor 36 to protect against unsuitable operation of the starter system 80. For example, the thermal overload protection devices 90 may decouple the motor 36 from the contactors 88 if one of the lines were to exceed a thermal threshold and/or otherwise becomes unsuitable for operations.

The solid-state circuit breaker 14 may improve on other starter technologies by enabling the contactors 88 and the thermal overload protection devices 90 to be replaced by the solid-state circuit breaker 14. For example, the control system 18 may operate according to firmware (e.g., software and/or instructions stored in the memory 26 or storage 28 executable by the processor 24 to cause the control system 18 to perform control operations on the solid-state circuit breaker 14) to mimic operations performed by the contactors 88 and/or the thermal overload protection devices 90. The control system 18 may load one or more start-up profiles. The control system 18 may drive the solid-state circuit breaker 14 based on a respective of the start-up profile to change signals output from the solid-state circuit breaker 14. For example, the control system 18 may cause a first terminal (T1) 92A, or any of the terminals, to transmit signals from the line-side before a second terminal (T2) 92B, or any of the terminals, consistent with an example operation of the starter system 80. The control system 18 may operate the solid-state circuit breaker 14 according to one or more thermal models. A thermal model may set overcurrent thresholds and/or monitoring ranges and/or define permitted or impermissible changes in transmitted current (e.g., $\Delta di/\Delta dt$) based at least in part on motor curves of the motor 36 (e.g., expected outputs from the motor 36 in response to inputs).

In this way, when the control system 18 receives sensing data from one or more current sensors and/or voltage sensors, the control system 18 may predict whether an overcurrent event is statistically likely to occur based on one or more thermal modes. For example, the solid-state circuit breaker 14 may include one or more current transformers to sense currents associated with the solid-state circuit breaker 14 and/or one or more potential transformers to sense voltages associated with the solid-state circuit breaker 14, and the control system 18 may use the voltages and/or currents when determining how to operate the solid-state circuit breaker 14. The control operations of the control system 18 may involve analyzing a thermal model of the motor 36, inputs to and/or outputs from the solid-state circuit breaker 14, a thermal model of the solid-state circuit breaker 14, or the like. For example, the control system 18 may analyze time-current characteristic curves of the solid-state circuit breaker 14 defined in the model to determine when to open the solid-state circuit breaker 14. In some cases, the control system 18 may monitor changes in current transmitted (e.g., $\Delta di/\Delta dt$) from the solid-state circuit breaker 14 to determine when changes in current are happening relatively too fast and/or at a rate that is greater than (or otherwise outside of) a threshold value defined by the thermal model of the motor 36. In this way, since the starter system 82 includes the solid-state circuit breaker 14 capable of operating to protect the solid-state circuit breaker 14 and/or the motor 36 similar to the contactors 88 and/or the thermal overload protection devices 90, the starter system 82 may not include the contactors 88 and/or the thermal overload protection devices 90.

Figure 6:
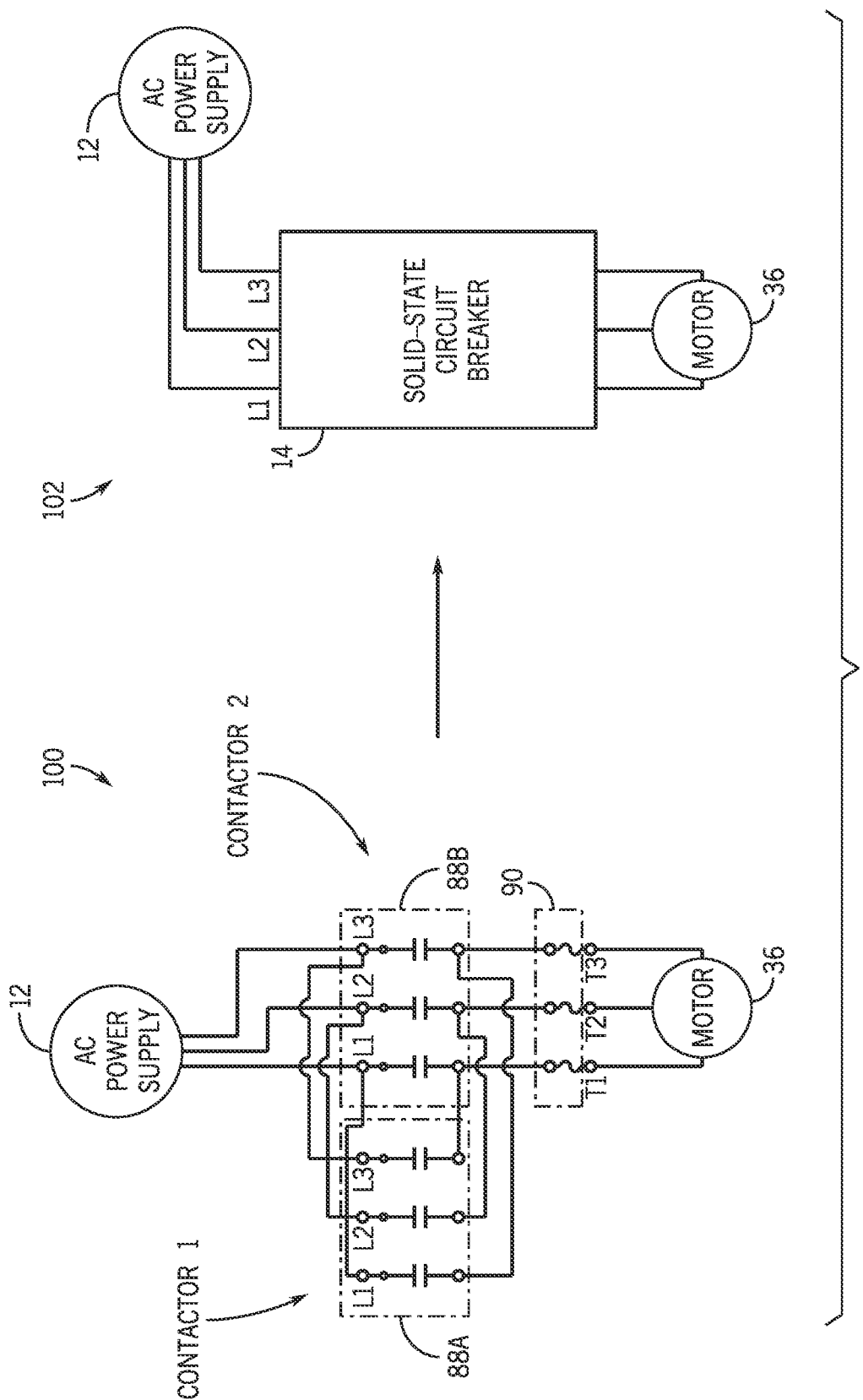
FIG. 6 is a block diagram of a first reversing starter system and a second reversing starter system that uses the solid-state circuit breaker of FIG. 1 to control a motor, in accordance with an embodiment.

In some cases, a reversing starter capable of driving the motor 36 in a forward or a reverse (e.g., non-forward) direction is used to drive the motor 36. To elaborate, FIG. 6 is a block diagram of a reversing starter 100 and a reversing starter 102. To form a reversing starter, one or more contactors 88B are added to certain starters and interlocked with the contactors 88 (e.g., contactors 88A) to provide electrical phase reversal of two phases. For example, contactors 88A are interlocked with contactors 88B of the reversing starter 100. By interlocking the contactors 88 and swapping phases (e.g., first line (L1) and third line (L3) at the load-side of the contactors 88B relative to the load-side of the contactors 88A), either contactors 88A or contactors 88B may be engaged in the "on" position at a same time. Since the second contactor 88B has two electrical phases swapped (e.g., L1, L3), the electrical phase rotation is 180 degrees from the first contactor 88A, and thus may drive the motor 36 in the reverse direction.

Similar to the starter system 80 and the starter system 82 of FIG. 5, inclusion of the solid-state circuit breaker 14 in the reversing starter 102 may permit removal of the contactors 88 (e.g., contactors 88A and contactors 88B) and the overload protection devices 90. In this way, the solid-state circuit breaker 14 may couple (e.g., directly couple) between a power supply (e.g., AC power supply 12) and/or line-side of the motor 36 and the motor 36. Furthermore, in some embodiments, the solid-state circuit breaker 14 may include a mechanical air gap that provides the galvanic isolation that the galvanic disconnecting devices 84 provide, thereby permitting removal of the galvanic disconnecting devices 84 from the reversing starter 102.

In the cases of the starter system 82 of FIG. 5 and the reversing starter 102 of FIG. 6, branch circuit protection provided by the galvanic disconnecting devices 84 may be provided as a function of the solid-state circuit breaker 14. For example, the solid-state circuit breaker 14 may be capable of providing circuit interruption and/or short circuit protection suitable to various standards of electrical governing bodies based at least in part on control operations of the control system 18 operating the solid-state circuit breaker 14 in accordance with the standards. Furthermore, in some embodiments, the solid-state circuit breaker 14 may include an integrated air-gap disconnect and/or integrated galvanic disconnecting device to further isolate the solid-state circuit breaker 14 in the event of a fault occurring (e.g., isolate in addition to any air-gap function of the solid-state circuit breaker 14).

Figure 7:
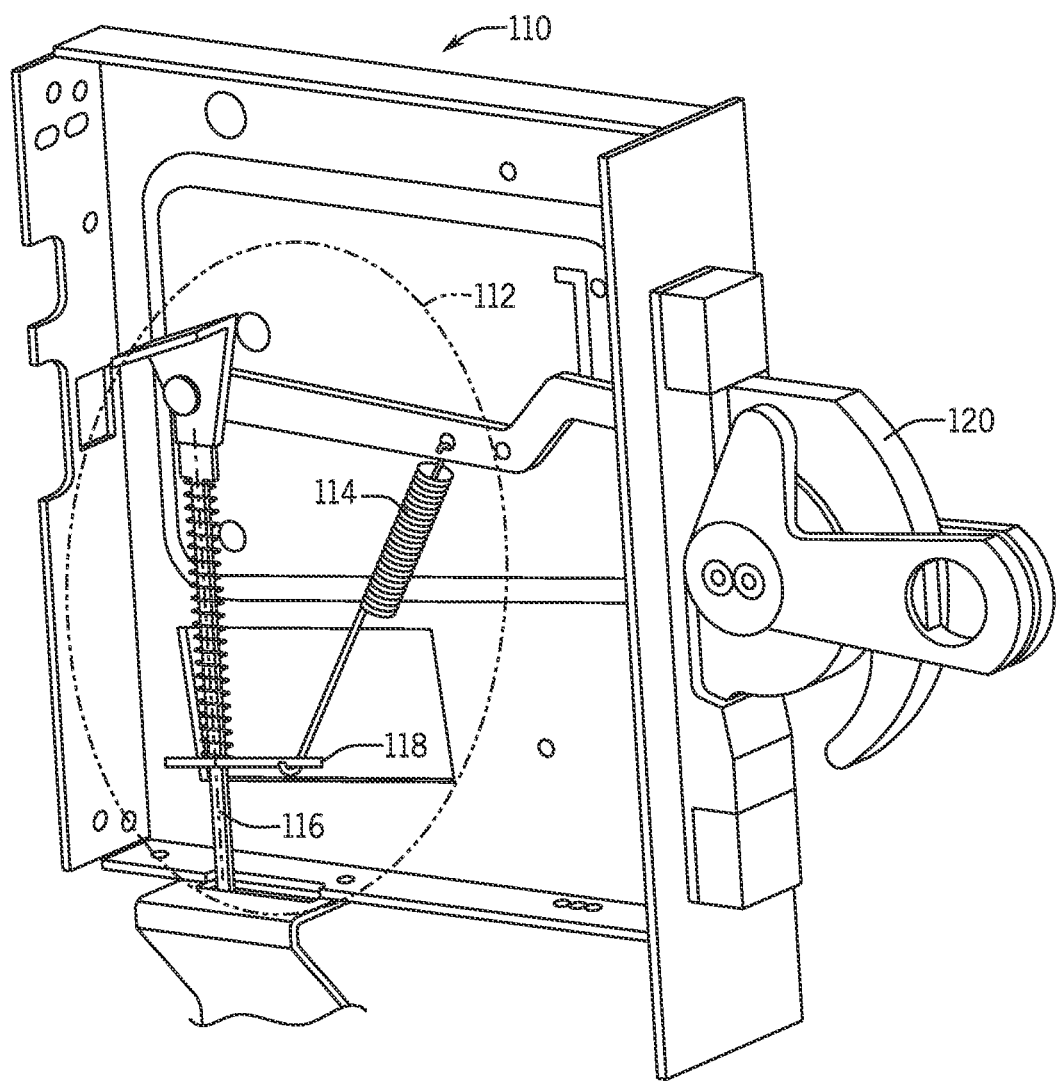
FIG. 7 is an illustration of a housing unit for the solid-state circuit breaker of FIG. 1, in accordance with an embodiment.

To elaborate, FIG. 7 is an illustration of a housing unit 110 for the solid-state circuit breaker 14, where the solid-state circuit breaker 14 may be disposed within the housing unit 110. The housing unit 110 may include a mechanical device 112 designed to operate a galvanic disconnecting device associated with (e.g., galvanic disconnecting devices 84) and/or disposed within the solid-state circuit breaker 14, providing mechanical galvanic isolation. The mechanical device 112 may include a latch device 114 (e.g., spring that operates interconnecting devices) to decouple a supply-side (e.g., line-side) from a load-side of the solid-state circuit breaker 14 using the galvanic disconnecting device for maintenance access or withdrawal of the housing unit 110. For example, the mechanical device 112 may operate to interlock the housing unit 110 and/or drawer door of the housing unit 110 with the latch device 114 and/or a device coupled or operable by the latch device 114.

When interlocked, the solid-state circuit breaker 14 may not be removed from a cabinet space within a motor control center and/or an installation site based at least in part on the latch device 114 locking the solid-state circuit breaker 14 in place. For example, the latch device 114 may control a position on an axis 116 of a metal plate 118. When a handle 120 of the housing unit 110 is operated into an "off" position (e.g., when the solid-state circuit breaker 14 is de-energized), the latch device 114 may pull the latch device 114 taught, causing the metal plate 118 to move upward on the axis 116. This motion may adjust any interlocking circuitry of the solid-state circuit breaker 14 to permit removal of the solid-state circuit breaker 14 from a motor control center cabinet and/or from the housing unit 110. When the handle 120 is operated into an "on" position (e.g., when the solid-state circuit breaker 14 is energized) and/or a "trip" position (e.g., de-energized in response to an undesired operation), the latch device 114 may release the latch device 114, causing the metal plate 118 to move downward on the axis 116. The metal plate 118 moving downward on the axis 116 may adjust at least some interlocking circuitry of the solid-state circuit breaker 14 to block access to the solid-state circuit breaker 14. In this way, the solid-state circuit breaker 14 may be mechanically blocked from being accessed (e.g., being removed from a motor control center cabinet and/or from the housing unit 110, being opened for inspection and/or maintenance) while the solid-state circuit breaker 14 is energized and/or in a trip state (e.g., permitting removal when the handle 120 is in an "off" position as opposed to "on" or "trip").

In this way, when the solid-state circuit breaker 14 is not energized, the mechanical device 112 may permit removal of the solid-state circuit breaker 14 from the cabinet space and/or the installation site based at least in part on the latch device 114 being operated into an orientation that permits such removal. Interlocking capabilities of the solid-state circuit breaker 14 may be provided additionally or alternatively to interlocking capabilities of the housing unit 110, such that a combination of a position of the handle 120 and an operational state of the solid-state circuit breaker 14 may permit or deny removal of the solid-state circuit breaker 14. For example, one or more sensed values may be used by the control system 18 to unlock or lock interlocking circuitry of the solid-state circuit breaker 14, such as in response to detecting no voltage or no current conditions within or from the solid-state circuit breaker 14. In some embodiments, a defeating mechanism may be included to override any interlocking devices of the solid-state circuit breaker 14, such as a key that a user may use to override an interlocking device.

Additionally or alternatively, an integrated air-gap disconnect device may be used with the solid-state circuit breaker 14, such as alone or in combination with the mechanical device 112. The integrated air-gap disconnect device may be associated with a push button. When the push button is pressed, interlocking circuitry may disengage and permit retraction springs to pull contacts of the solid-state circuit breaker 14 away from each other to form an air gap between the contacts. For example, the integrated air-gap disconnect device may cause galvanic isolation between a supply-side and a load-side of the solid-state circuit breaker 14 in response to the latch device 114 being extended by movement of the handle 120. Powering-down electronics of the solid-state circuit breaker 14 before operating the integrated air-gap disconnect device may reduce a likelihood of arcing occurring when the air gap is being formed between the contacts.

The control system 18 may use the integrated air-gap disconnect when performing lockout/tagout control operations and/or when electrically isolating devices coupled downstream of the solid-state circuit breaker 14 from devices coupled upstream of the solid-state circuit breaker 14. Integrated air-gap disconnects may be used in combination with air gaps provided internal to the solid-state circuit breaker 14 and/or in combination with interlocking circuitry of the housing unit 110. In some cases, additional external disconnect switches may be used in combination with solid-state circuit breakers 14 to further electrically disconnect a line-side of the solid-state circuit breaker 14 from the solid-state circuit breaker 14.

Figure 8:
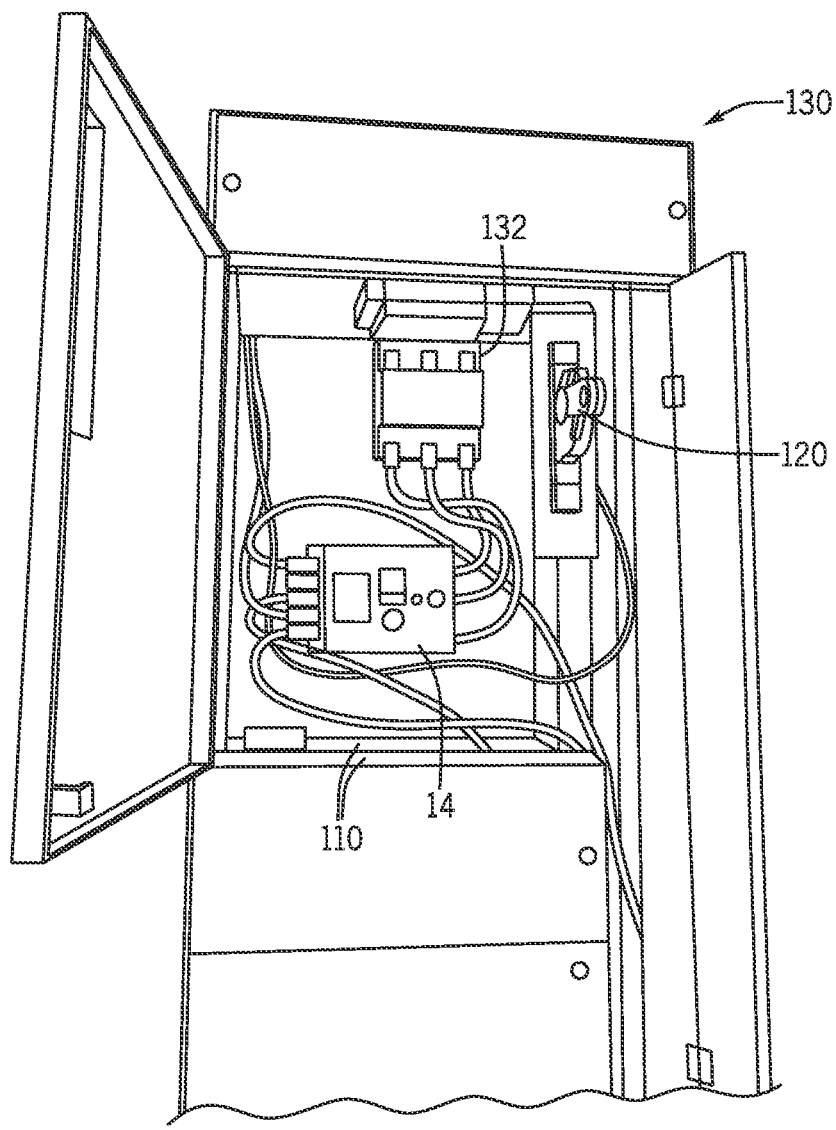
FIG. 8 is an illustration of a cabinet that includes the housing unit of FIG. 7 and the solid-state circuit breaker of FIG. 1, in accordance with an embodiment.

For example, FIG. 8 is an illustration of a cabinet 130 that includes the housing unit 110 and the solid-state circuit breaker 14. The housing unit 110 may also include one or more upstream switches 132. In this example system, the galvanic disconnecting device 84 may be replaced by the solid-state circuit breaker 14 coupled to additional circuit breakers or fused disconnect switches (e.g., upstream switches 132) upstream from the solid-state circuit breaker 14. The upstream switches 132 may respectfully couple to each line feeding the solid-state circuit breaker 14 (e.g., L1, L2, L3). Each upstream switch of the upstream switches 132 may couple in series with the solid-state circuit breaker 14 to provide disconnecting circuit isolation. The upstream switches 132 may be used in combination with any of the systems and/or methods described herein. The handle 120 may electrically disconnect the solid-state circuit breaker 14 and/or the upstream switches 132. In some cases, the upstream switches 132 may automatically isolate the solid-state circuit breaker 14 from one or more power supplies in response to the upstream switches 132 detecting a change in transmitted current (e.g., $\Delta di/\Delta dt$). The upstream switches 132 may be used to decouple the solid-state circuit breaker 14 from the line-side of the solid-state circuit breaker 14 additional to or alternative of an integrated air-gap disconnect.

When operating, the solid-state circuit breaker 14 may generate heat since semiconductor circuitry tends to produce heat when conducting currents. Thermal management systems may be installed within a motor control center assembly to dissipate and remove heat from air ambient to the solid-state circuit breakers 14.

Figure 9:
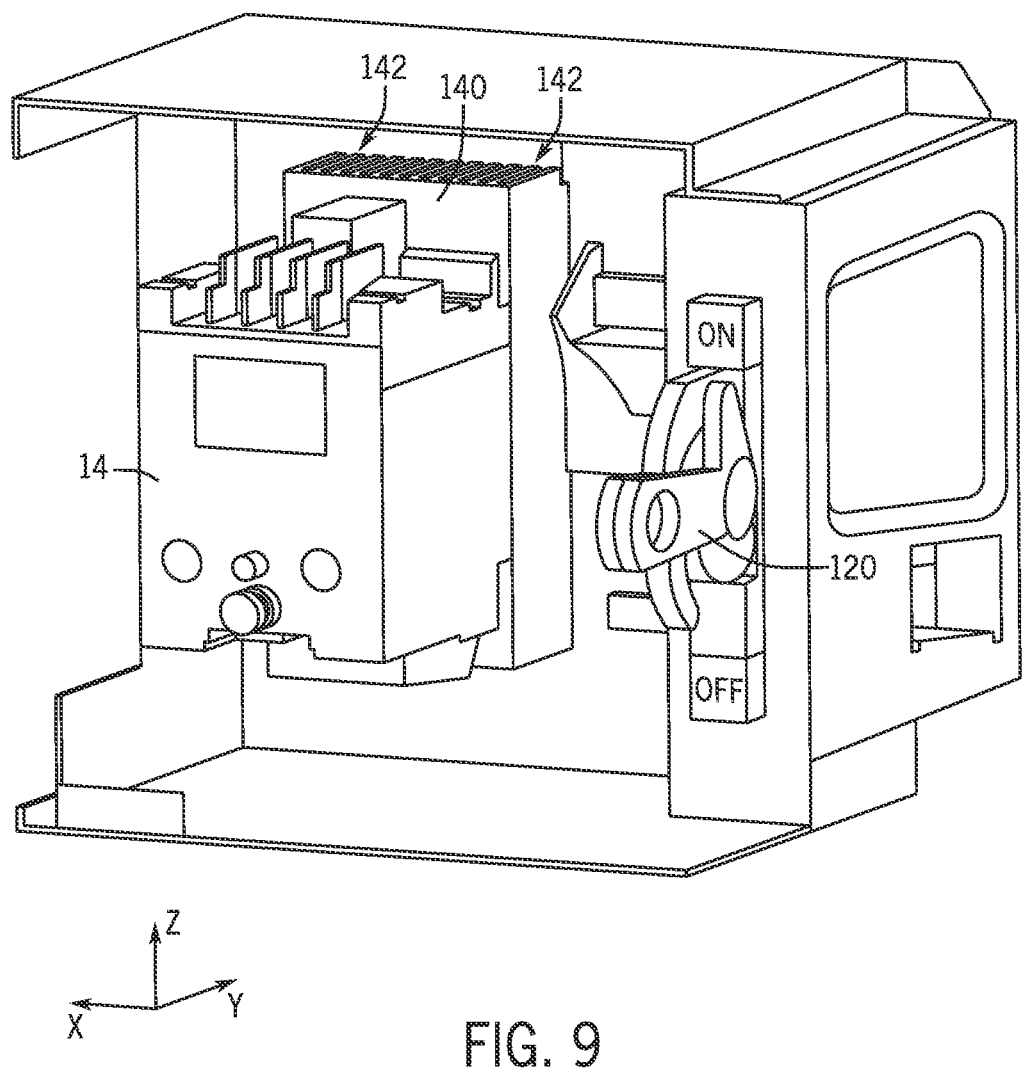
FIG. 9 is an illustration of the housing unit of FIG. 7 and the solid-state circuit breaker of FIG. 1, in accordance with an embodiment.

For example, FIG. 9 is an illustration of the housing unit 110 including the solid-state circuit breaker 14 and an example thermal management device 140. The thermal management device 140 may couple the solid-state circuit breaker 14, such as through metal of the housing unit 110. Coupling the solid-state circuit breaker 14 to the thermal management device 140 may provide a path to dissipate thermal energy generated by the solid-state circuit breaker 14. In the depicted example, the thermal management device 140 is a heat sink formed from aluminum or other suitable material and coupled to the solid-state circuit breaker 14. In some cases, the thermal management device 140 may reduce a temperature of the solid-state circuit breaker 14 by leveraging conduction for temperature control, such as through passive air conduction and/or through active air conduction (e.g., pressurized air being passed over conduction paths). In some cases, a thermal connection between the solid-state circuit breaker 14 and the thermal management device 140 may be a heat pipe design that leverages passive air conduction and/or active air conduction.

The thermal management device 140 of FIG. 9 is depicted as mounted in a north-south orientation such that fins 142 of the thermal management device 140 may be orientated perpendicular to a ground plane. In this way, the ground plane may correspond to an orientation of the x-y-axis and the fins 142 of the heat sink may follow an orientation of the z-axis. In some cases, positioning the fins 142 such that air may conduct through the fins 142 following the z-axis may enhance cooling capabilities of the thermal management device 140 since air is able to efficiently conduct upwards between air gaps 144 of the fins 142.

When installing one or more solid-state circuit breakers 14 in an enclosure, sometimes no isolation is provided between adjacent solid-state circuit breakers 14. In this way, when one of the solid-state circuit breakers 14 is to be accessed, each solid-state circuit breaker 14 within the enclosure may be powered down and/or be brought to an operational state suitable for access. This enclosure may be improved if each of the solid-state circuit breakers 14 are installed to have respective hinged covers and individual enclosures around each solid-state circuit breaker 14.

Figure 10:
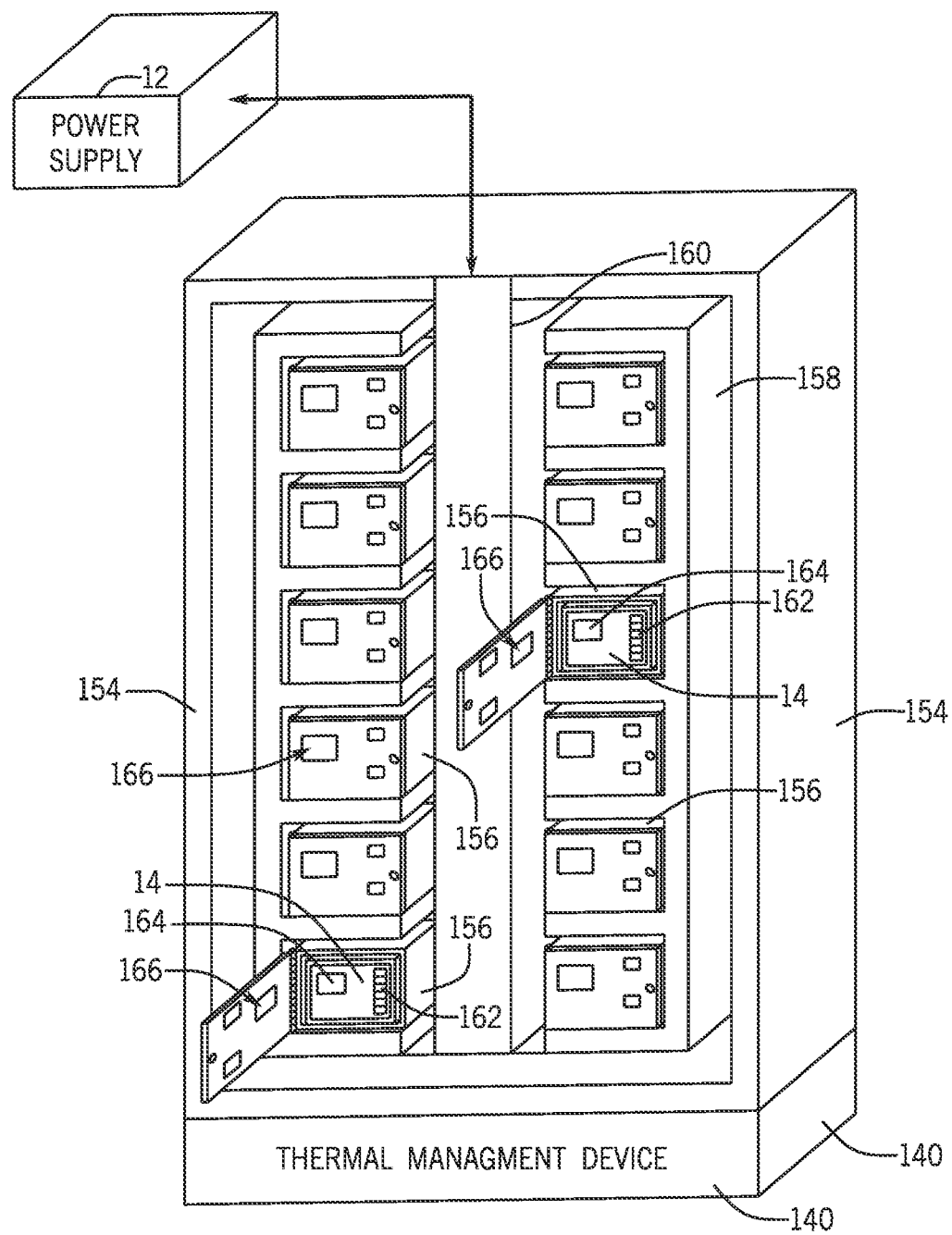
FIG. 10 is an illustration of an enclosure that includes the housing unit of FIG. 7 and the solid-state circuit breaker of FIG. 1.

FIG. 10 is an illustration of an enclosure 154, such as the cabinet 130 of FIG. 8, storing multiple housing units 110, and thus multiple solid-state circuit breakers 14, and an example thermal management device 140. Respective enclosures 156 may permit each respective solid-state circuit breaker 14 to be accessed without having to power-off and/or isolate the targeted solid-state circuit breaker 14 from a nearby solid-state circuit breaker 14. Providing multiple solid-state circuit breakers 14 in separate enclosures 156 disposed within the enclosure 154 may improve industrial automation system deployment since the individual solid-state circuit breakers 14 and corresponding load wires may be serviced or replaced while power is still applied to the other solid-state circuit breakers 14.

Each respective enclosure 156 within the enclosure 154 may couple to a wire gutter 158 (e.g., wire pathway, "wireways") to permit organization of wires incoming or outgoing to respective of the solid-state circuit breakers 14. This infrastructure may permit adjacently stored solid-state circuit breakers 14 (e.g., adjacent within an enclosure 154 but individually enclosed within additional, nested enclosures 156) to share a common bus 160. The common bus 160 may permit transmission of electrical signals from the power supply 12 to each of the solid-state circuit breakers 14 (e.g., from a power distribution network common power supply). In this way, each of the solid-state circuit breakers 14 may share a common line side, and/or a common power supply for control signals and/or status signals.

Furthermore, the common bus 160 may permit a common communication backplane to be provided to the solid-state circuit breakers 14. In this way, while each solid-state circuit breaker 14 may be disposed within separate housing enclosures 156, the individual solid-state circuit breakers 14 may share one or more inputs or conduction pathways with each other.

In some cases, the solid-state circuit breakers 14 may attach to a power distribution bus via plug-in connections, bolt-on connections, or the like (e.g., terminal blocks 162). Furthermore, each of the solid-state circuit breakers 14 may couple and/or power respective electrical loads 16 via outputs from the respective terminal blocks 162. In this way, the multiple solid-state circuit breakers 14 may be supplied from a same power supply 12 and protect and/or output to one or more electrical loads 16. Furthermore, each solid-state circuit breaker 14 may include a display 164. Each display 164 may present status information and/or sensed values associated with the respective solid-state circuit breaker 14.

The enclosure 154 may provide a thermal management device 140 to be shared by each of the solid-state circuit breakers 14, such as a common heatsink or common fan assembly (e.g., for active air conduction cooling methods). The solid-state circuit breakers 14 may provide temperate control to one or more of the solid-state circuit breakers 14 at a substantially similar time. For example, the solid-state circuit breakers 14 may mate with a common heatsink surface of the thermal management device 140 by direct metal-to-metal contact between the common heatsink surface and each respective solid-state circuit breaker 14 (e.g., a metal surface of each enclosure 156). In some cases, the metal-to-metal contact between the surfaces is smooth, is an interface of cross-hatch embossed patterns, or any combination of therein. For example, one solid-state circuit breaker 14 may use a smooth contact between the surfaces while a different solid-state circuit breaker 14 may use a non-smooth contact between the surfaces.

Additionally or alternatively, a cradle that enables withdrawal of the solid-state circuit breaker 14 from the enclosure 154 may be installed for each solid-state circuit breaker 14 to improve ease of connection or disconnection of the solid-state circuit breaker 14 from the common bus 160 and/or thermal management device 140. For example, the cradle may couple prongs of the solid-state circuit breaker 14 to prongs associated with the common bus 160 and/or the thermal management device 140. The cradle may be designed to retrofit to the solid-state circuit breaker 14. Similarly, the control system 18 may be coupled to the common bus 160 and/or the thermal management device 140, while having a separate housing to isolate the control system 18 from the solid-state circuit breakers 14. The enclosure 154 assembly may be provided in a larger overall enclosure with a power bus (e.g., a portion of the common bus 160 disposed between the enclosure 154 and the power supply 12) to permit the common bus 160 to be fed from an adjacent enclosure, such as an adjacent motor control center, switchboard, switchgear power distribution bus, or the like.

It is noted that a hinged door is used for the example enclosure 156 shown in FIG. 10. It should be understood that any suitable door or system may be used to control access to the solid-state circuit breaker 14. For example, the enclosure 156 may enclose the solid-state circuit breaker 14 such that a viewing window 166 is not present. Furthermore, the enclosure 156 may include a hinge on any side of the enclosure 156 (e.g., left-side, right-side, top-side, bottom-side) or the like. The enclosure 156 and/or the enclosure 154 may be of any suitable geometry and/or the wire gutters 158 may include any suitable wires associated with the solid-state circuit breaker 14, such as to improve organization of the wires within the enclosure 154.

It is noted that the solid-state circuit breaker 14 may be controlled by the control system 18 using a variety of communication methods, and thus the common bus 160 and/or the wire gutters 158 may include a variety of communicative couplings to permit communication between respective solid-state circuit breakers 14 and the control system 18. For example, the communication methods may include using hardwired inputs and/or hardwired outputs, FIELDBUS® networks (e.g., controller area network (CAN), CANBUS®), Ethernet networks (e.g., Ethernet/IP, MODBUS® transmission control protocol (TCP)), wireless communications, near field communications (e.g., BLUETOOTH®, ZIGBEE®, or Mesh-type communications), or the like. It is also noted that the solid-state circuit breaker 14 may interface to a graphical user interface associated with a centralized control system and/or engineering workstation communicatively coupled to the control system 18.

Additionally or alternatively, the solid-state circuit breaker 14 may also include an internal control system within the housing unit 110 and/or each enclosure 156. The internal control system may perform local control operations, such as opening the solid-state circuit breaker 14 in case of internally detected fault or other local operating condition. When both the internal control system and the control system 18 are used, the internal control system may respond to local (e.g., micro-scale) operating conditions while the control system 18 may respond to global and/or system-level (e.g., macro-scale, unit-wide) operating conditions. In this way, when the control system 18 detects a fault upstream of the solid-state circuit breaker 14, the control system 18 may generate one or more commands (e.g., control commands) to cause the solid-state circuit breaker 14 to operate (e.g., open in case of a fault condition) in response to the system-level operating condition. Similarly, when the internal control system detects a fault internal to the housing unit 110, the internal control system may operate the solid-state circuit breaker 14 to open. The internal control system, in some cases, may operate the solid-state circuit breaker 14 without explicit command from the control system 18 (e.g., independent of control command from a processor of the control system 18) and may notify the control system 18 after operating the solid-state circuit breaker 14 of the fault and/or operation (e.g., by generating a notification and/or message after the opening of the solid-state circuit breaker 14). The control system 18 may even perform an operation in response to the notification from the internal control system. For example, the control system 18 may further disconnect the electrical load from the power supply 12 by opening a switch in response to the notification, such as galvanic disconnecting devices 84 coupled between the power supply and the solid-state circuit breaker 14. The internal control system of the solid-state circuit breaker 14 may also operate a portion of the solid-state circuit breaker 14. For example, the SiC switches of the solid-state circuit breaker 14 may be able to be partially driven by the internal control system. This may permit a change in output on each of various output load lines of the solid-state circuit breaker, such that a first line (L1) and/or first terminal (T1) may output a voltage at a different frequency and/or at a different time than a second line (L2), a second terminal (T2), third line (L3), and/or a third terminal (T3). It is noted that in some cases, the solid-state circuit breaker 14 may use firmware to change a relative phase and/or amplitude of the output electrical signals relative to the input electrical signals, such as to drive the motor 36 according to a forward starting configuration or a reverse starting configuration. In this way, the solid-state circuit breaker 14 may be capable of reversing a rotation associated with its output phases without using the contactors 88.

Furthermore, different operators may have different levels of authentication that permit the different operators varying control and/or access levels to the operation of the solid-state circuit breaker 14. Indeed, some operator profiles (e.g., user profiles) may have different levels of access to information associated with operation of the solid-state circuit breaker 14. For example, some operators may have higher or lower permission profiles than other operators. Different permission profiles may permit some operators to operate the solid-state circuit breaker 14 (e.g., using the control system 18) to open or close and/or check a status of the solid-state circuit breaker 14, while some operators are permitted to check the status of the solid-state circuit breaker 14 without having permission to operate the solid-state circuit breaker 14 open or close. The permission profiles may also be used in combination with the mechanical device 112 and/or interlocking circuitry of the solid-state circuit breaker 14 to selectively permit or deny access to the solid-state circuit breaker 14.

In some cases, the permission profiles may be used to provide a first user with a first level of control associated with the solid-state circuit breaker 14 and to provide a second user with a second level of control associated with the solid-state circuit breaker 14, where the first level of control and the second level of control may be different. User profiles may define a level of control assigned to the respective user. For example, a user having a first characterization may be permitted to access hardware and software of a solid-state circuit breaker 14 while a different user having a second characterization may be permitted to only access hardware of the solid-state circuit breaker 14 without having permission to access software of the solid-state circuit breaker 14. User authorization levels may be maintained via the different characterizations of users and stored within a user profile accessible by control circuitry of a motor control center. Furthermore, user authorization levels may be device-specific (e.g., such that one operator trained on a solid-state circuit breaker 14 may or may not have authorization to operate on a chain of solid-state circuit breakers 14), unit-specific (e.g., referring to a portion of an industrial automation facility-such that operators may be set to operate within specific portions of the industrial automation system), or any suitable granularity of operation or control. In some cases, user authorization levels may be set to expire after a duration of time, which may correspond to training procedures associated with the industrial automation facility. For example, an operator may be trained on how to remove the solid-state circuit breaker 14 but that training may need to be renewed each year anniversary of the original training. In some cases, the control system 18 may determine when that operator is trying to access the solid-state circuit breaker 14 and inform the operator that the training is set to expire, or, when a current date or time is a threshold of time close to the expiration date or time, is close to expiring. Furthermore, when the training of the operator expires, the control system 18 may adjust or remove the authorization granted to the operator (e.g., the control system 18 may update the user profile to reflect the change in authorization).

In some cases, a solid-state circuit breaker 14 may also be operated using selective coordination schemes. For example, a group of solid-state circuit breakers 14 may be logically grouped on some electrical loads 16, such as elevators, life-critical loads, standby power systems, high-value assets, or the like, as a way manage power supplied to the electrical loads 16 during abnormal electrical conditions. Two devices that monitor overcurrent and/or overvoltage conditions may be selectively coordinated (e.g., operated in accordance with and/or using selective coordination schemes) when a downstream overcurrent device relatively nearest to a fault opens before a corresponding upstream overcurrent device opens. Overcurrent protection schemes may use one or more solid-state circuit breakers 14, one or more different protection devices, or any combination thereof, to protect the electrical loads 16.

Technical effects of the present disclosure include techniques for protecting an electrical load from abnormal operation, transients, overvoltage, or the like, that may affect power supplied to the electrical load. A solid-state circuit breaker may be included upstream from an electrical load. The solid-state circuit breaker may be manufactured to not use mechanical switching to electrically isolate its output from its input. Reducing or eliminating use of mechanical switching may reduce a likelihood of arc flash and/or reduce a severity of exposed incident energy if an arc flash were to occur. Furthermore, a control system may communicatively couple to the solid-state circuit breaker and may receive operational indications and/or statuses from the solid-state circuit breaker. The control system may update a model (e.g., a model rendered on a display) using information received from the solid-state circuit breaker in real-time.

This model may be used to support real-time updates of a motor control center (MCC) model and electrical statuses of respective solid-state circuit breakers, providing for an improved monitoring and deployment solution of MCC monitoring technologies.

While only certain features of the presently disclosed embodiments have been illustrated and described herein, many modifications and changes will occur to those skilled in the art. It is, therefore, to be understood that the appended claims are intended to cover all such modifications and changes as fall within the true spirit of the embodiments described herein.

The invention claimed is:

1. A motor starter, comprising:
a metal enclosure configured to house a solid-state circuit breaker, wherein the solid-state circuit breaker is configured to respectively couple between a power supply and a motor; and
a thermal management device comprising a plurality of fins, wherein the thermal management device is mounted to the solid-state circuit breaker in a north-south orientation perpendicular to a ground plane, and wherein the thermal management device is configured to reduce a temperature of the metal enclosure while the solid-state circuit breaker performs one or more switching operations.

2. The motor starter of claim 1, wherein the thermal management device is configured to leverage conduction of heat from the solid-state circuit breaker through passive air conduction or active air conduction.

3. The motor starter of claim 1, wherein the thermal management device is configured to thermally connect to the solid-state circuit breaker via a heat pipe design.

4. The motor starter of claim 1, wherein the thermal management device is configured to couple to the solid-state circuit breaker via a direct metal-to-metal contact.

5. The motor starter of claim 4, wherein the direct metal-to-metal contact comprises a smooth contact, an interface of cross-hatch embossed patterns, or both.

6. The motor starter of claim 1, comprising:
a control system communicatively coupled to the power supply, the motor, and the solid-state circuit breaker, wherein the control system is configured to perform operations comprising:
initiating a soft-start operation according to a start-up profile associated with the motor;
receiving an operational status from the solid-state circuit breaker during the soft-start operation;
receiving an indication of the temperature from one or more sensors; and
adjusting an operation of the solid-state circuit breaker based on the operational status and the temperature.

7. The motor starter of claim 6, wherein the control system is configured to adjust the operation of the solid-state circuit breaker based on the operational status and the temperature at least in part by:
comparing the temperature to a threshold value;
in response to determining that the temperature is greater than the threshold value, generating a control signal to open at least one pole associated with the solid-state circuit breaker; and
transmitting the control signal to the solid-state circuit breaker.

8. The motor starter of claim 7, wherein the control system is configured to, in response to determining that the temperature is greater than the threshold value, transmit an additional control signal to upstream protection circuitry to open to isolate the solid-state circuit breaker from a power source.

9. The motor starter of claim 6, comprising a handle coupled to the metal enclosure, wherein the control system is configured to permit removal of the solid-state circuit breaker based on a combination of a position of the handle and the operational status.

10. A motor control center, comprising:
a plurality of enclosures, wherein each enclosure of the plurality of enclosures comprises a solid-state circuit breaker, and wherein the solid-state circuit breaker of each enclosure of the plurality of enclosure is configured to respectively couple between a power supply and one or more electrical loads; and
a common thermal management device mounted to the plurality of enclosures, wherein the plurality of enclosures is disposed on the common thermal management device, and wherein the common thermal management device is configured to reduce a temperature of the plurality of enclosures while at least one of a plurality of solid-state circuit breakers associated with the plurality of enclosures performs one or more switching operations.

11. The motor control center of claim 10, wherein the common thermal management device is configured to respectively couple to each of the plurality of enclosures via a direct metal-to-metal connection.

12. The motor control center of claim 10, comprising a processor configured to:
receive an instruction to perform a soft-start operation using a respective solid-state circuit breaker of the plurality of solid-state circuit breakers, wherein the soft-start operation is associated with a respective electrical load of the one or more electrical loads;
in response to receiving the instruction, initiate the soft-start operation via the respective solid-state circuit breaker;
receive an indication of the temperature; and
adjust an operation of the respective solid-state circuit breaker based on the temperature.

13. The motor control center of claim 12, wherein the processor is configured to:
perform the soft-start operation via the respective solid-state circuit breaker;
receive additional information during the soft-start operation; and
in response to determining that the temperature is greater than a first threshold value and that the additional information is greater than a second threshold value, adjust the operation of the respective solid-state circuit breaker at least in part by:
generating a control signal configured to open a portion of the respective solid-state circuit breaker; and
transmitting the control signal to the respective solid-state circuit breaker.

14. The motor control center of claim 13, wherein the additional information comprises a phase-phase voltage, a phase-to-ground voltage, an input current, an output current, a frequency, a power output, an open status of the respective solid-state circuit breaker, or any combination thereof.

15. The motor control center of claim 13, wherein the processor is configured to:
in response to receiving the instruction, receive an additional indication of an additional temperature associated with the respective electrical load; and adjust an additional operation of the respective solid-state circuit breaker based on the additional temperature associated with the respective electrical load and the temperature associated with the respective solid-state circuit breaker.

16. A method, comprising:

receiving, via a processor, an operational status from a solid-state circuit breaker during an operation of the solid-state circuit breaker;

receiving, via the processor, an indication of a temperature associated with the solid-state circuit breaker from one or more measurement circuits coupled to one or more parts of the solid-state circuit breaker during the operation; and adjusting, via the processor, the operation of the solid-state circuit breaker based on the operational status and the temperature.

17. The method of claim 16, comprising:

determining, via the processor, a threshold value based on a historical temperature average associated with the solid-state circuit breaker, wherein the solid-state circuit breaker comprises silicon-carbide;

comparing, via the processor, the temperature to the threshold value; and adjusting, via the processor, the operation of the solid-state circuit breaker based on the operational status and the temperature at least in part by generating a control signal configured to adjust the operation of the solid-state circuit breaker based on the comparison and the operational status.

18. The method of claim 16, comprising:

receiving, via the processor, an indication of metering data associated with the solid-state circuit breaker during a soft-start operation; and adjusting, via the processor, the operation of the solid-state circuit breaker based on the operational status, the temperature, and the metering data.

19. The method of claim 18, wherein the metering data comprises phase-phase voltage, a phase-to-ground voltage, an input current, an output current, a frequency, a power output, or any combination thereof.

20. The method of claim 16, comprising:

accessing, via the processor, a thermal model associated with an electrical load of the solid-state circuit breaker, the solid-state circuit breaker, or both; and adjusting, via the processor, the operation of the solid-state circuit breaker based on the operational status, the temperature, and the thermal model.

* * * * *